United States Patent
Karpov et al.

(10) Patent No.: US 11,239,156 B2
(45) Date of Patent: Feb. 1, 2022

(54) PLANAR SLAB VIAS FOR INTEGRATED CIRCUIT INTERCONNECTS

(71) Applicant: Intel Corporation, Santa Clara, CA (US)

(72) Inventors: Elijah Karpov, Portland, OR (US); Manish Chandhok, Beaverton, OR (US); Nafees Kabir, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/824,366

(22) Filed: Mar. 19, 2020

(65) Prior Publication Data

US 2021/0296231 A1   Sep. 23, 2021

(51) Int. Cl.
| | | |
|---|---|---|
| *H01L 23/52* | (2006.01) | |
| *H01L 23/522* | (2006.01) | |
| *H01L 23/528* | (2006.01) | |
| *H01L 23/532* | (2006.01) | |
| *H01L 21/768* | (2006.01) | |

(52) U.S. Cl.
CPC .... *H01L 23/5226* (2013.01); *H01L 21/76816* (2013.01); *H01L 21/76822* (2013.01); *H01L 21/76831* (2013.01); *H01L 21/76877* (2013.01); *H01L 23/5283* (2013.01); *H01L 23/53209* (2013.01)

(58) Field of Classification Search
CPC ......... H01L 21/76816; H01L 21/76822; H01L 21/76877; H01L 21/76831; H01L 23/53209; H01L 23/5283; H01L 23/5226

USPC .......................................................... 257/774
See application file for complete search history.

(56) References Cited

U.S. PATENT DOCUMENTS

| | | | | |
|---|---|---|---|---|
| 6,972,985 | B2 * | 12/2005 | Rinerson | G11C 11/5614 |
| | | | | 365/148 |
| 8,432,040 | B2 * | 4/2013 | Yu | H01L 23/528 |
| | | | | 257/774 |
| 8,848,424 | B2 * | 9/2014 | Ikeda | G11C 13/003 |
| | | | | 365/148 |
| 10,825,515 | B1 * | 11/2020 | Kim | G11C 13/0026 |
| 2002/0182855 | A1 | 12/2002 | Agarwala et al. | |
| 2015/0056800 | A1 | 2/2015 | Mebarki et al. | |
| 2019/0304902 | A1 | 10/2019 | Subramanian et al. | |

* cited by examiner

Primary Examiner — Luan C Thai
(74) Attorney, Agent, or Firm — Essential Patents Group, LLP

(57) ABSTRACT

Integrated circuitry comprising devices electrically coupled through a plurality of interconnect levels in which lines of a first and second interconnect level are coupled through a planar slab via. An interconnect line may include a horizontal line segment within one of the first or second interconnect levels, and the slab via may be a vertical line segment between the first and second interconnect levels. A planar slab via may comprise one or more layers of conductive material, which have been deposited upon a planarized substrate material that lacks any features that the conductive material must fill. A planar slab via may be subtractively defined concurrently with a horizontal line of one or both of the first or second interconnect levels.

15 Claims, 16 Drawing Sheets

PLANAR SLAB VIAS FOR INTEGRATED CIRCUIT INTERCONNECTS

BACKGROUND

Demand for higher performance integrated circuits (ICs) in electronic device applications has motivated increasingly dense transistor architectures. IC metallization structures employed to interconnect transistors into circuitry need to scale to higher density in step with increasing transistor density. For over fifty years, IC metallization has relied upon an "etch and fill" paradigm, illustrated in the isometric cross-sectional views of FIG. 1A-1C.

As shown in FIG. 1A, a conventional interconnect structure includes a metal line 101 within a first interconnect level. A transverse width of metal line 101 has some lateral critical dimension CD1. A dielectric material 102 is over metal line 101, and a "via" 103 is subtractively patterned through dielectric material 102 in the z-dimension to expose a portion of metal line 101. Via 103 has a depth $D_V$ associated with the thickness of dielectric material 102. A diameter of via 103 has some lateral critical dimension CD2. Typically, CD2 is made smaller than CD1 by an amount sufficient to ensure via 103 will land upon metal line 101. The ratio of depth $D_V$ to CD2 is referred to as the aspect ratio of via 103. Metal line width CD1 scales down as metal line density increases with increasing transistor density, and so CD2 must also scale down and the aspect ratio of via 103 increases.

As further illustrated in FIG. 1B, via 103 is filled with one or more metals. In this example, a conductive liner material layer 105 is in contact with sidewalls of dielectric material 102 and a fill material layer 107 is within liner material layer 105. The act of filling via 103 with conductive material(s) becomes increasingly difficult as the aspect ratio of via 103 increases. For example, a void 107 can result if fill material 107 fails to completely fill via 103. As aspect ratio increases, greater efforts are made to eliminate the liner material and/or otherwise improve the via fill.

As further shown in FIG. 1C, the conventional interconnect structure includes a metal line 108 within a second interconnect level. Metal line 108 extends in the x-y dimension of the second interconnect level to intersect conductive material in via 103 so that the first and second interconnect levels are electrically connected.

Various techniques for forming metal lines 101, 108 and via 103 have been employed over the years. In the earliest high volume ICs, metal line 101 was often tungsten or aluminum, either of which were amenable to being blanket deposited and then subtractively patterned with an reactive ion etch process. Via 103 was then filled with another metal, often again tungsten or aluminum that was blanket deposited and also subtractively etched to further form metal line 108 in the second level of metallization. During this period corrosion and other failures associated with filling via 103 were common. Some thirty years ago there was a shift to damascene metallization technology, where metal lines 101 and 108 became structures that, much like via 103, comprise a metal (e.g., copper) that is deposited (e.g. plated) into topographic features (e.g., trenches) that are subtractively etched into dielectric material 102.

In duel-damascene techniques, both a via and an overlying trench are etched into a dielectric material and then filled concurrently, for example to form both metal line 108 and via 103 with the fill process. In such techniques, the via aspect ratio is therefore effectively increased beyond via depth $D_V$, by the additional height (z-dimension) of metal line 108. Dimensional scaling of interconnect metallization, particularly in the lowest metallization levels having highest metal line density, has therefore entailed a shift to single damascene processing whereby via 103 is patterned and filled before metal line 108 is patterned and filled. However, as the pitch of metal lines continues to shrink, new fabrication techniques and interconnect structural architectures will be needed to overcome the fundamental limitations of filling topographic features of increasingly greater aspect ratio with conductive material.

Also, just as the use of copper for IC interconnects ushered in the era of damascene interconnect fabrication techniques, a shift away from copper to an alternative conductive material offering superior IC performance may bring an end to damascene processing. For example, if that new conductive material is even less amenable to filling topographic features than copper, new fabrication techniques and interconnect structures may then be needed to enable any use of the new conductive material in IC interconnect applications.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 6 illustrates a mobile computing platform and a data server machine employing an IC having planar slab interconnect structures, in accordance with some embodiments.

DETAILED DESCRIPTION

Figure 1A:
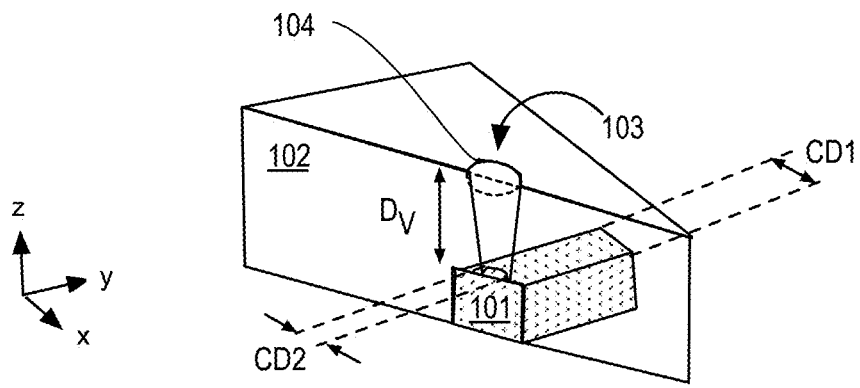
FIGS. 1A, 1B and 1C illustrate isometric cross-sectional views of an IC interconnect structure, in accordance with convention.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material disposed over or under another may be directly in contact or may have one or more intervening materials. Moreover, one material disposed between two materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In accordance with some embodiments herein, monolithic integrated circuitry includes one or more device layer electrically coupled through a plurality of interconnect levels in which lines of a first or second interconnect level are connected through a planar slab via. In some embodiments, an interconnect line includes horizontal segment within one of the first or second interconnect levels, and the slab via is a vertical segment of the line between the first and second interconnect levels. A planar slab via may comprise one or more layers of conductive material that have been deposited upon a planarized substrate material that lacks any features that the conductive material must fill. A planar slab via may be subtractively defined along with subtractive definition of an interconnect line in one of the first or second interconnect levels so that the slab via is contiguous with, and self-aligned to, a horizontal segment of the interconnect line. Accordingly, the via etching and trench etching typical of conventional damascene interconnect processing may be replaced with subtractive patterning of substantially planar conductive material layers. Challenges associated with scaling a via etch and/or a via metal fill to ever higher aspect ratios may therefore be addressed, further advancing integrated circuit interconnect technology.

Figure 2A:
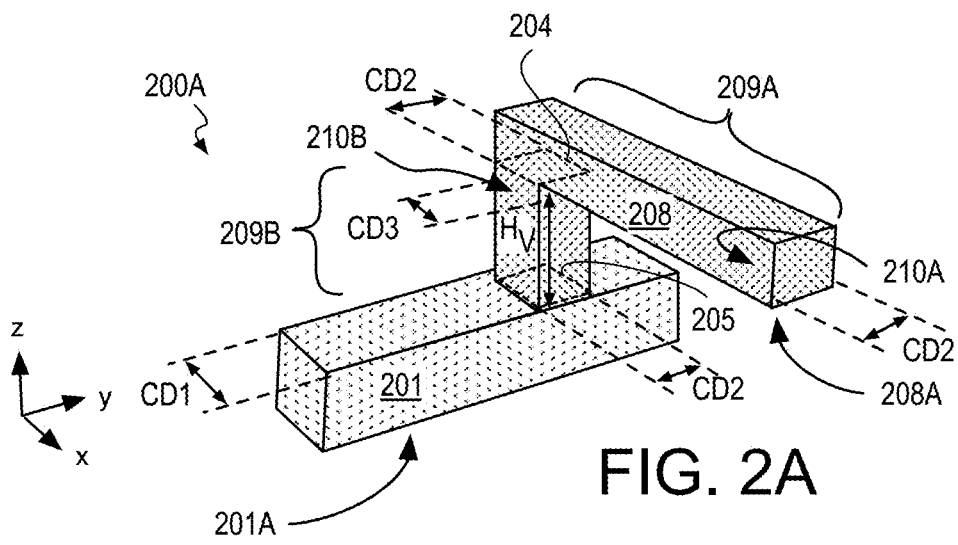
FIGS. 2A, 2B, and 2C illustrate isometric views of planar slab interconnect structures, in accordance with some embodiments.
Figure 2B:
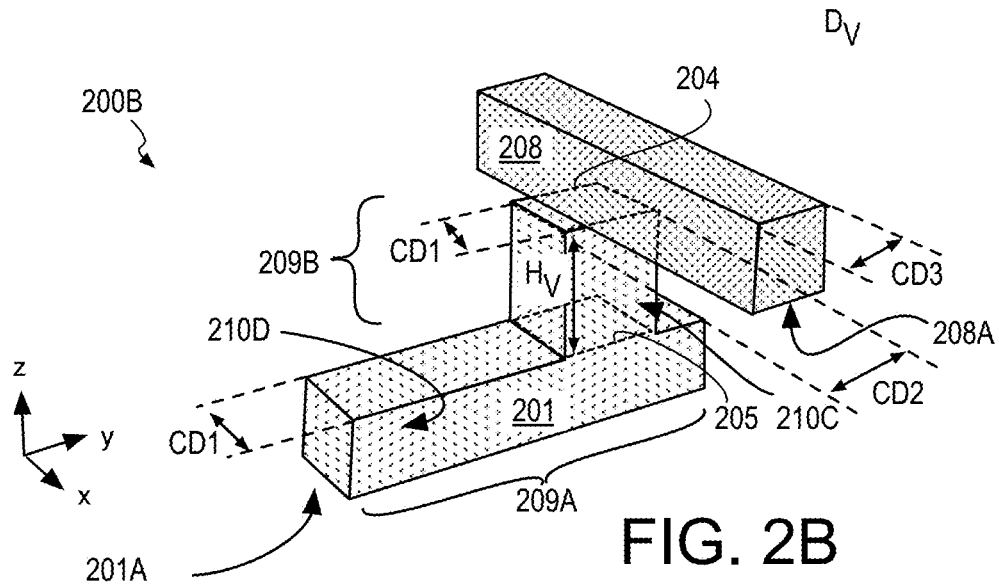
Figure 2C:
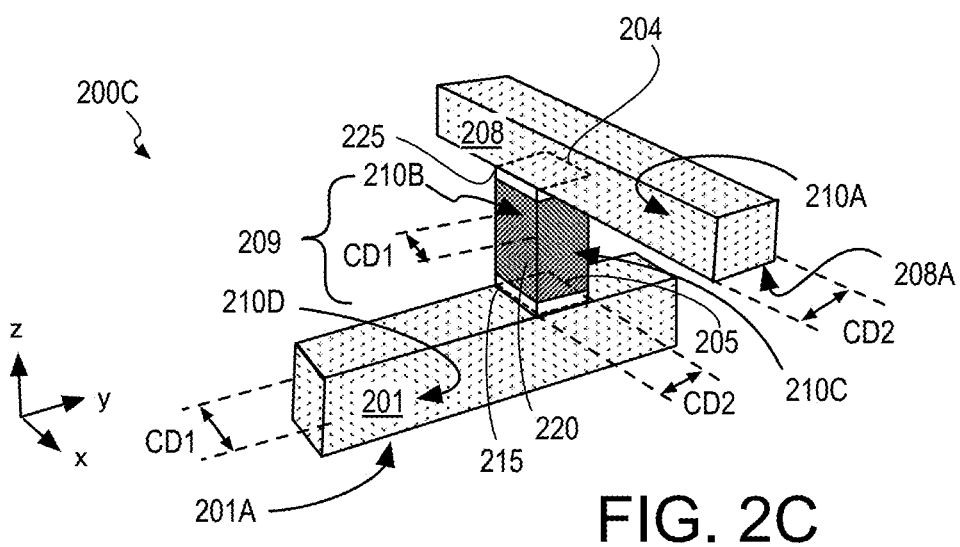

FIG. 2A-2C illustrate isometric views of planar slab interconnect structures, in accordance with some embodiments. The exemplary structures 200A, 200B and 200C illustrated in FIGS. 2A, 2B and 2C, respectively, illustrate a number of architectural variations possible under a general rubric taught in the context of these structures. Structures other than those illustrated are possible, and so these examples are merely illustrative. While various salient features of structures 200A, 200B and 200C are called out as being indicative of the general rubric taught herein, one of ordinary skill will appreciate that there are myriad other structural features that may be particular to an interconnect structure fabricated according to embodiments herein. Although illustrated alone for the sake of clarity, each of the structures 200A, 200B and 200C are merely representative of a portion of an IC interconnect that may be above or below a IC device layer (not depicted).

Referring first to FIG. 2A, planar slab interconnect structure 200A includes an interconnect line 201. Interconnect line 201 is one interconnect line of many such lines in a first interconnect level. Interconnect line 201 has a longitudinal length along the y-axis, and a transverse width along the x-axis. The longitudinal length may vary, but is generally longer than the transverse width. The transverse width is associated with a critical dimension (CD1). Transverse width with CD1 may also vary, but in some examples is less than 25 nm, and may be 10 nm, or less. Interconnect line 201 is substantially planar and has a bottom line surface 201A that defines an x-y plane of the first interconnect level. Interconnect line 201 therefore extends horizontally in a first direction (along y-axis) on the plane of the first interconnect level.

Planar slab interconnect structure 200A further includes an interconnect line 208. Interconnect line 208 is one interconnect line of many such lines in a second interconnect level. Interconnect line 208 includes a horizontal line segment 209A that has a longitudinal length along the x-axis, and a transverse width along the y-axis. Horizontal line segment 209A is therefore non-parallel to line 201 in a projection of the interconnect x-y planes along the z-axis. In this exemplary embodiment, line segment 209A crosses line 201 substantially orthogonally. The longitudinal length of horizontal line segment 209A may vary, but is generally longer than the transverse width associated with a critical dimension CD2. The transverse width of CD2 may vary, but in some examples is also less than 25 nm, and may be 10 nm, or less. Horizontal line segment 209A is substantially planar and has a bottom surface 208A that defines an x-y plane of the second interconnect level. Horizontal line segment 209A therefore extends horizontally in a first direction (along x-axis) on the plane of the second interconnect level.

Interconnect line 208 further includes a vertical line segment 209B that has a longitudinal length along the z-axis, a first transverse width along the y-axis, and a second transverse width along the x-axis. In some exemplary embodiments the first and second transverse widths define a substantially rectangular cross-section 204 at the interface between horizontal and vertical line segments 209A, 209B. With the plane of the second interconnect level being defined by bottom surface 208A, cross-section 204 is a plane substantially parallel to the x-y plane of bottom surface 208A. The longitudinal length (or slab via height $H_V$) of vertical line segment 209B may vary with the amount of separation desired between interconnect levels. In the illustrated example, vertical line segment 209B has height $H_V$ greater than both the first transverse width of critical dimension CD2 and a second transverse width of critical dimension CD3. At cross-section 204, vertical line segment 209B has the same transverse width of CD2 as horizontal line segment 209A. The transverse width CD3 may vary, and in the exemplary embodiment is different than the transverse width CD1 of interconnect line 201. Although, CD3 may be larger than CD1, in the illustrated example CD3 is smaller than CD1. In some examples, CD3 is also less than 25 nm, and may be 10 nm, or less.

Vertical line segment 209B is perfectly aligned to horizontal line segment 209A such that a sidewall 210A extending in the line length direction is parallel to, and continuous with, a sidewall 210B. As shown in FIG. 2A, there is no discernable lateral (e.g., along y-axis) offset between sidewall 210A and sidewall 210B at their interface where cross-section 204 is denoted.

Vertical line segment 209B also has a substantially rectangular cross-section 205 where vertical line segment 209B interfaces interconnect line 201. Cross-section 205 is substantially parallel to cross-section 204, such that cross-section 205 may also be substantially parallel to the x-y plane associated with at least one of the first or second interconnect levels. Because of the rectangularity of cross-section 204 and/or cross-section 205, vertical line segment 209B is referred to herein as a "slab via" to descriptively distinguish the structure from a via having a cross-section that is not substantially rectangular and would instead then be more like a wire than a slab. In the exemplary embodiment, cross-section 205 has the same first transverse width CD2. The transverse width of cross-section 205 may however deviate from that of cross-section 204, for example as a function of the anisotropy of a subtractive patterning process, as described further below.

Interconnect lines 201 and 208 may each have any material (chemical) composition having suitable electrical conductivity. In some exemplary embodiments, interconnect line 201 has a different composition than interconnect line 208, as denoted by the different field shading employed in FIG. 2A. The field shading in FIG. 2A also emphasizes how the vertical and horizontal line segments 209A and 209B are contiguous and of substantially the same material, and hence both are referred to as segments of interconnect line 208. In some embodiments, one or both of interconnect lines 201 and 208 comprise a metal. The metal may be a pure elemental metal or an alloy composition. In some embodiments, one or both of interconnect lines 201 and 208 comprise at least one of W, Al, Ti, Ru, or Mo. In some other embodiments, one or both of interconnect lines 201 and 208 comprise a carbon-based material. Many carbon-based materials are known to have good electrical conductivity. In some advantageous embodiments, at least one of interconnect lines 201 and 208 comprises graphite (e.g., pyrolytic or crystalline graphite). In some other carbon-based embodiments, at least one of interconnect lines 201 and 208 comprises one or more carbon nanotubes. Notably, one or more of the conductive material examples provided above may be more amenable to subtractive patterning through an etch process than they are amenable to being deposited into, and/or filling, a high-aspect ratio opening. Such conductive materials are therefore well suited to the structures described herein.

Referring next to FIG. 2B, planar slab interconnect structure 200B similarly includes an interconnect line 201 in a first interconnect level, and an interconnect line 208 in a second interconnect level. For the sake of clarity, structural features in FIG. 2B sharing one or more attributes of structural features introduced in the context of FIG. 2A retain the reference numbers employed in FIG. 2A.

Whereas in structure 200A interconnect line 208 has a vertical segment 209B below a horizontal segment 209A, in structure 200B interconnect line 201 has vertical segment 209B above horizontal segment 209A. As further illustrated in FIG. 2B, horizontal line segment 209A has a longitudinal length along a direction of the y-axis, and a transverse width of CD1 along the x-axis. CD1 may again be less than 25 nm, and may be 10 nm, or less, for example. Horizontal line segment 209A is substantially planar and has a bottom surface 201A that defines an x-y plane of the first interconnect level. The longitudinal length of horizontal line segment 209A is generally longer than the transverse width associated with a critical dimension (CD1). Interconnect line 201 further includes vertical line segment 209B that has a longitudinal length along the z-axis, a first transverse width along the x-axis and a second transverse width along the y-axis. In some exemplary embodiments, the first and second transverse widths define a substantially rectangular cross-section 205 at the interface between horizontal and vertical line segments 209A, 209B.

Interconnect line 208 is substantially planar and has bottom surface 208A defining a plane of the second interconnect level. Interconnect line 208 is non-parallel to line 201 in a projection of the two interconnect x-y planes along the z-axis. In this exemplary embodiment, line 208 crosses horizontal line segment 209A substantially orthogonally. With the plane of the second interconnect level being defined by bottom surface 208A, cross-section 204 of vertical line segment 209B is substantially parallel to the x-y plane. At cross-section 205 where vertical line segment 209B interfaces with horizontal line segment 209A, vertical line segment 209B has the same transverse width of CD1 as the horizontal line segment 209A. In the illustrated examples, longitudinal length (or slab via height $H_V$) of vertical line segment 209B is again greater than both the first transverse width of critical dimension CD1 and a second transverse width of critical dimension CD2.

At the cross-section 204 where vertical line segment 209B interfaces with interconnect line 208, the transverse width of CD2 may vary, and in the exemplary embodiment CD2 is different than CD3 of interconnect line 208. Although CD2 is larger than CD3 in the illustrated example, CD2 may instead be smaller than CD3. In some examples, CD3 is also less than 25 nm, and may be 10 nm, or less.

As also shown in FIG. 2B, vertical line segment 209B is perfectly aligned to horizontal line segment 209A such that sidewall 210D extending in the line length direction is parallel to, and continuous with, sidewall 210C. There is no discernable lateral offset between sidewall 210A and sidewall 210B at their interface where cross-section 205 is denoted.

Vertical line segment 209B has a substantially rectangular cross-section 204 where vertical line segment 209B interfaces interconnect line 208. Cross-section 204 is parallel to cross-section 205, such that cross-section 204 may also be substantially parallel to the x-y plane associated with at least one of the first or second interconnect levels. Being another example of a "slab via," cross-sections 204 and/or cross-section 205 are substantially rectangular. In the exemplary embodiment, cross-section 204 has the same transverse width CD1 as cross-section 205. However, cross-sections 204 and 205 may have different transverse widths, for example as a function of the anisotropy of an etch employed to subtractively pattern vertical line segment 209B (e.g., as further described below).

In structure 200B, interconnect lines 201 and 208 may each be of any conductive material, and may, for example, have any of the compositions described above for structure 200A. In some exemplary embodiments, interconnect line 201 has a different composition than interconnect line 208, as denoted by the different field shading employed in FIG. 2B. The field shading in FIG. 2B also illustrates how the vertical and horizontal line segments 209A and 209B are contiguous and/or of substantially the same material, and hence are both referred to as segments of interconnect line 201.

Referring next to FIG. 2C, planar slab interconnect structure 200C similarly includes an interconnect line 201 in a first interconnect level, and an interconnect line 208 in a second interconnect level. In FIG. 2C, structural features sharing one or more attributes introduced in the context of FIG. 2A are labeled with the reference number introduced in FIG. 2A. Structure 200C illustrates a third example where a slab via 209 joining interconnect line 201 to interconnect line 208 is not a contiguous segment of either interconnect line 201 or interconnect line 208. As described further below, the slab via 209 may be subtractively patterned along with the subtractive patterning of either, or both, interconnect line 201 and interconnect line 208.

Figure 1B:
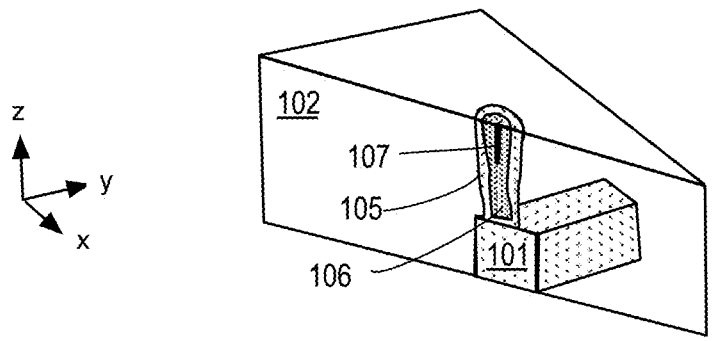
Figure 1C:
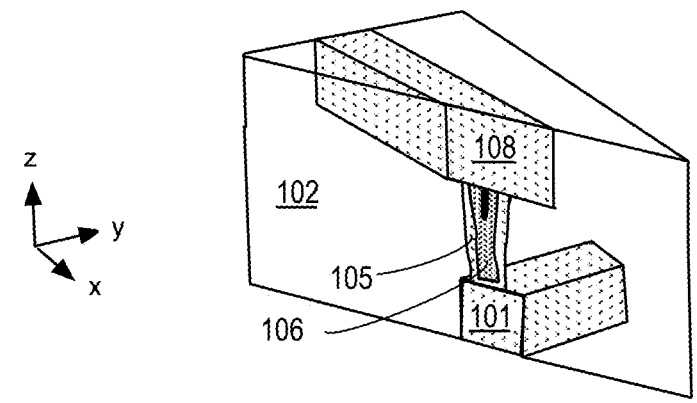

As shown in FIG. 2C, slab via 209 includes stack of material layers comprising a first material layer 215 in contact with interconnect line 201, a second material layer 225 in contact with interconnect line 208, and a third material layer 220 between material layers 215 and 225. The planar aspect of the slab interconnect structures in accordance with embodiments herein is highlighted by the multiple material layers of slab via 209. As shown, the interfaces of slab via material layers 215, 220 and 225 are all substantially parallel to the substantially parallel interconnect level x-y planes defined by bottom interconnect line surfaces 201A and 208A. The planarity of material layers 215, 220 and 225 is in stark contrast to a material stack that results from successively depositing materials into a topographic feature, such as via hole 103 in dielectric material 102 (FIG. 1A). Whereas in FIG. 1C the planes of conductive material layers 105 and 107 are not parallel to planes of interconnect lines 101 and 108, all the conductive materials of structure 200C (FIG. 2C) are substantially in parallel planes. Hence, any number of the material layers present in interconnect lines 201, 208 and intervening slab via 209 are substantially indistinguishable from layers deposited as a single material stack preform because all of the material layers are deposited upon a planarized underlayer lacking any topographic features. Although the planarity of slab via 209 is most readily apparent in FIG. 2C, the vertical line segment 209B in FIGS. 2A and 2B has equivalent planarity.

In structure 200C, interconnect line 201 has a longitudinal length along a direction of the y-axis, and transverse width of CD1 along the x-axis. Interconnect line 208 has a longitudinal length along a direction of the x-axis, and transverse width of CD2 along the y-axis. CD1 and CD2 may each again be less than 25 nm, and may be 10 nm, or less, for example. Interconnect line 201 is substantially planar and has a bottom surface 201A that defines an x-y plane of the first interconnect level. Interconnect line 208 is substantially planar and has a bottom surface 208A defining a plane of the second interconnect level. Interconnect line 208 is non-parallel to line 201 in a z-axis projection of the x-y planes, and in this exemplary embodiment crosses line 201 substantially orthogonally. With the plane of the second interconnect level being defined by bottom surface 208A, cross-section 204 of slab via 209 is substantially parallel to the x-y plane. At cross-section 204, slab via 209 has the same transverse width of CD2 as interconnect line 208. At cross-section 205, where slab via 209 interfaces with interconnect line 201, slab via 209 has the same transverse width of CD1 as interconnect line 201. In the illustrated examples, the longitudinal length (or slab via height $H_V$) of slab via 209 is greater than both the transverse width CD1 and the transverse width CD2.

As further shown in FIG. 2C, slab via 209 is perfectly aligned to interconnect line 208 such that sidewall 210A extending in the line length direction is parallel to, and continuous with, sidewall 210B. There is no discernable lateral offset between sidewall 210A and sidewall 210B at their interface where cross-section 204 is denoted. Slab via 209 is also perfectly aligned to interconnect line 201 such that sidewall 210C extending in the line length direction is parallel to, and continuous with, sidewall 210D. There is no discernable lateral offset between sidewall 210A and sidewall 210B at their interface where cross-section 205 is denoted. The sidewalls opposite of sidewall 210B and 210D similarly have no lateral offset from the respective intersecting line sidewalls. Hence, slab via 209 has one lateral dimension equal to that of a first interconnect line, and a second lateral dimension equal to that of a second interconnect line.

Being another example of a slab via, cross-section 204 and/or cross-section 205 again have substantially rectangular cross-sections. In the exemplary embodiment, cross-section 204 has the same transverse width of CD1 as cross-section 205. However, cross-sections 204 and 205 may have different transverse widths, for example as a function of etch anisotropy (e.g., as further described below).

In structure 200C, interconnect lines 201 and 208 may each have any conducive material composition, such as any of the compositions described above for structure 200A and/or 200B. In some exemplary embodiments, interconnect line 201 has the same composition an interconnect line 208, as denoted by the same field shading employed in FIG. 2C. Although 200C illustrates how multiple material layers may be present within a slab via, interconnect lines joined by a slab via may also include any number of material layers. For example, one or more of etch stop layers, polish stop layers and hardmask layers may be present anywhere within structures 200A, 200B or 200C. Advantageously, material layers of a slab via or at an interface of a slab via and an interconnect line are electrically conductive.

Although omitted for the sake of clarity, any of slab interconnect structures of 200A, 200B, 200C may be encapsulated with one or more dielectric materials, for example as further described below.

Figure 3:
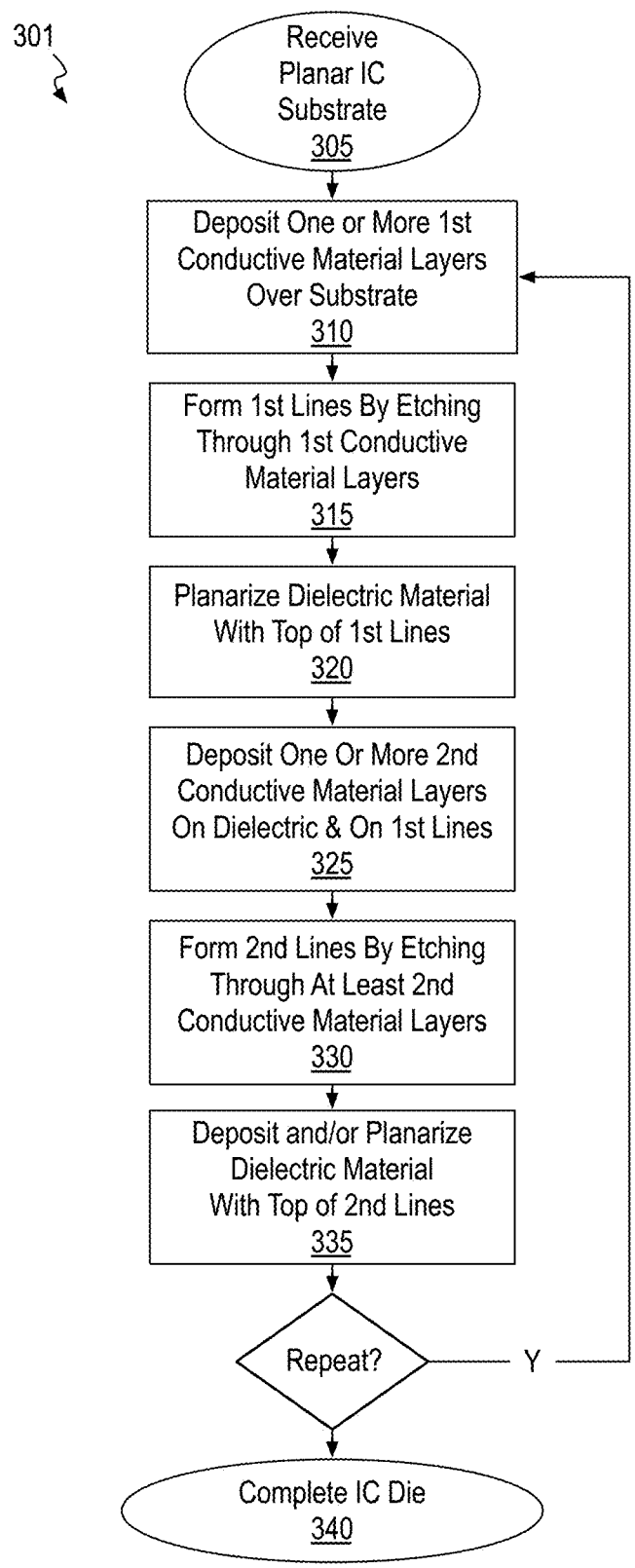
FIG. 3 is a flow diagram illustrating methods of fabricating planar slab interconnect structures, in accordance with some embodiments.

FIG. 3 is a flow diagram illustrating methods 301 for fabricating planar slab interconnect structures, in accordance with some embodiments. Methods 301 may be practiced to fabricate one or more of the slab interconnect structures illustrated in FIG. 2A-2C, for example. Methods 301 may also be practiced to fabricate slab interconnect structures other than those illustrated in FIG. 2A-2C. Similarly, one or more of the slab interconnect structures illustrated in FIG. 2A-2C may be fabricated according to methods other than methods 301. FIG. 4A-4E illustrate isometric views of an exemplary planar slab interconnect structure evolving during the practice of the methods 301, and are further referenced in the description of methods 301.

In FIG. 3, methods 301 begin with receiving an IC substrate at input 305. A top material surface of the IC substrate received is advantageously substantially planar having no topographic features of any significant aspect ratio requiring a conductive material fill. In some exemplary embodiments, the planarized surface includes both dielectric material and a top surface of conductive contacts that are coupled to terminals of a devices within an underlying device level of the IC substrate. The device level may comprise transistors, other semiconductor devices (e.g., diodes, memory devices), magnetic memory devices, ferroelectric memory devices, or the like.

At block 310, one or more first conductive material layers are deposited over the substrate surface. In exemplary embodiments where the substrate is planarized, the one or more first conductive material layers are similarly planar as-deposited. The first conductive material layers may include any number of material layers. In some embodiments, the first conductive material layers comprise one or more metals or non-metal conductive materials described above (e.g., graphite or other carbon-based material). Since there is no topography of any significant aspect ratio, virtually any deposition technique may be employed at block 310 such as, but not limited to one or more of PVD, CVD, plating, or layer transfer/bonding techniques.

At block 315, first interconnect lines are formed by etching through the first conductive material layers. Any masking and patterning process(es) may be employed at block 315 as embodiments are not limited in this context. For example, single patterning or multiple patterning techniques may be employed to define one or more masks around which the first conductive material layers are etched to define the first interconnect lines. Any etching process(es) suitable for the composition of the first conductive material layers may be performed at block 315. For example, one or more anisotropic plasma (reactive ion) etch processes may be performed to subtractively define first interconnect lines having substantially vertical sidewalls. Interconnect line sidewall angles may however vary as a function of etch parameters, etc. Following the interconnect line patterning, at block 320 a dielectric material is deposited over the lines and planarized with a top surface of the interconnect lines. Notably, the deposition, patterning and planarization processes performed at blocks 310, 315 and 320 may be performed once, or performed more than once, for example to iteratively define top and bottom portions of the first interconnect lines. The choice between performing one or more patterning etches to define the interconnect lines may depend, for example, on the line pitch and/or line aspect ratio that can be reliably achieved.

Figure 4A:
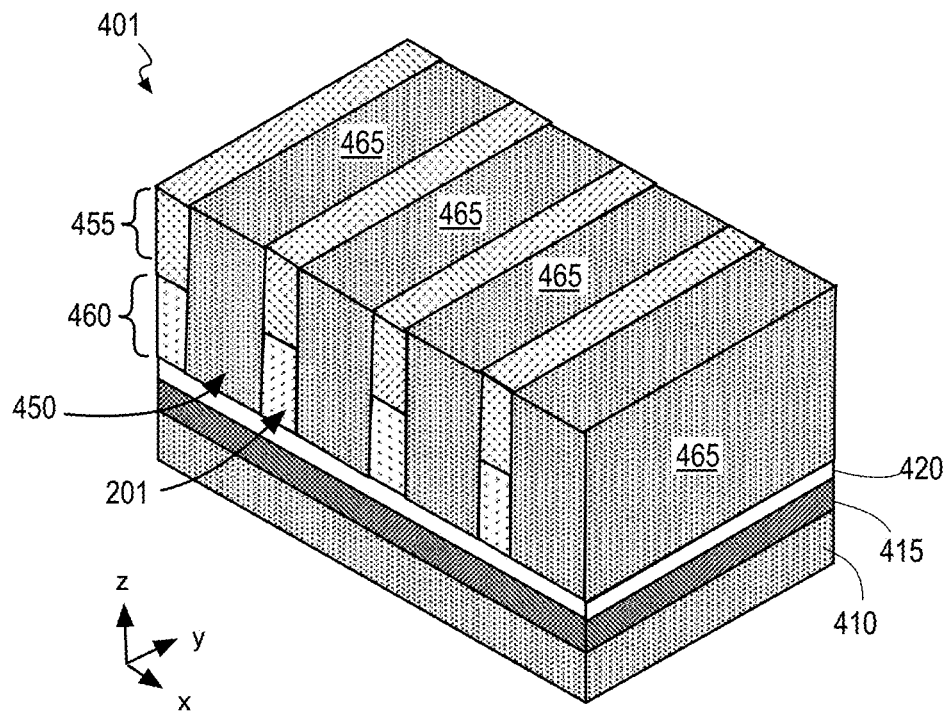
FIGS. 4A, 4B, 4C, 4D and 4E illustrate isometric views of a planar slab interconnect structure that may be formed through the practice of the methods shown in FIG. 3, in accordance with some embodiments.

In the example illustrated in FIG. 4A, IC device interconnect structure 401 includes a device layer 410. Dielectric material layers 415 and 420 are over device layer 410. Dielectric material layer 415 may be any dielectric material composition suitable for integrated circuitry such as silicon dioxide, a low-k dielectric, etc. Dielectric material layer 420 may have another dielectric material composition, such as one suitable as an etch stop layer with examples including silicon nitride and silicon oxynitride. Interconnect lines 201 extend in the y-dimension with dielectric material 465 in the space 450 between adjacent lines 201.

As shown, interconnect lines 201 include a top line portion 455 over a bottom line portion 460. In the illustrated embodiments, top line portion 455 comprises a first conductive material and bottom line portion 460 comprises a second conductive material, different than the first conductive material. In alternative embodiments top line portion 455 has the same material composition as bottom line portion 460. In still other embodiments, at least one of top line portion 455 or bottom line portion 460 comprises more than one planar material layer.

In advantageous embodiments, the interface between first and second conductive materials is substantially parallel with the x-y plane of dielectric material 420. In the example shown in FIG. 4A, top line portion 455 is in perfect alignment with bottom line portion 460, which is indicative of interconnect line portions 455 and 460 having been subtractively defined with a same etch mask (i.e., concurrently). In alternative embodiments, for example where the pitch of interconnect lines 201 is so small that aspect ratio of spaces between adjacent interconnect lines 201 poses a challenge, bottom line portion material may be first deposited over dielectric material 420 and then masked and etched into the bottom portion of interconnect lines 201. Dielectric material 465 may then be deposited over the bottom portion of interconnect lines 201, and planarized with a top surface of the bottom portion of interconnect lines 201. Top portion material may then be deposited over this planar surface and then masked and etched into the top portion of interconnect lines 201. Additional dielectric material 465 may then be deposited over the top portion of interconnect lines 201, and planarized with a top surface of the top portion of interconnect lines 201 substantially as depicted in FIG. 4A. For such iterative interconnect line etch embodiments, a lateral offset (e.g., in the x-dimension) between top line portion 455 and bottom line portion 460 may occur as a result of non-zero misregistration between the masks employed to subtractively define the top and bottom portions of the interconnect lines 201 separately.

Returning to FIG. 3 with lower level interconnect lines defined, methods 301 continue at block 325 where one or more second conductive material layers are deposited on the planarized dielectric and top surfaces of the lower level interconnect lines. Because of the planarization at block 320, there are again no topographic features of any significant aspect ratio present during conductive material deposition at block 325. The second conductive materials may include any number of material layers. In some embodiments, the second conductive material layers comprise one or more metals or non-metal conductive materials described above (e.g., graphite or other carbon-based material). Since there is no topography of any significant aspect ratio, any deposition technique may be employed such as one or more of PVD, CVD, plating, or layer transfer/bonding techniques.

Figure 4B:
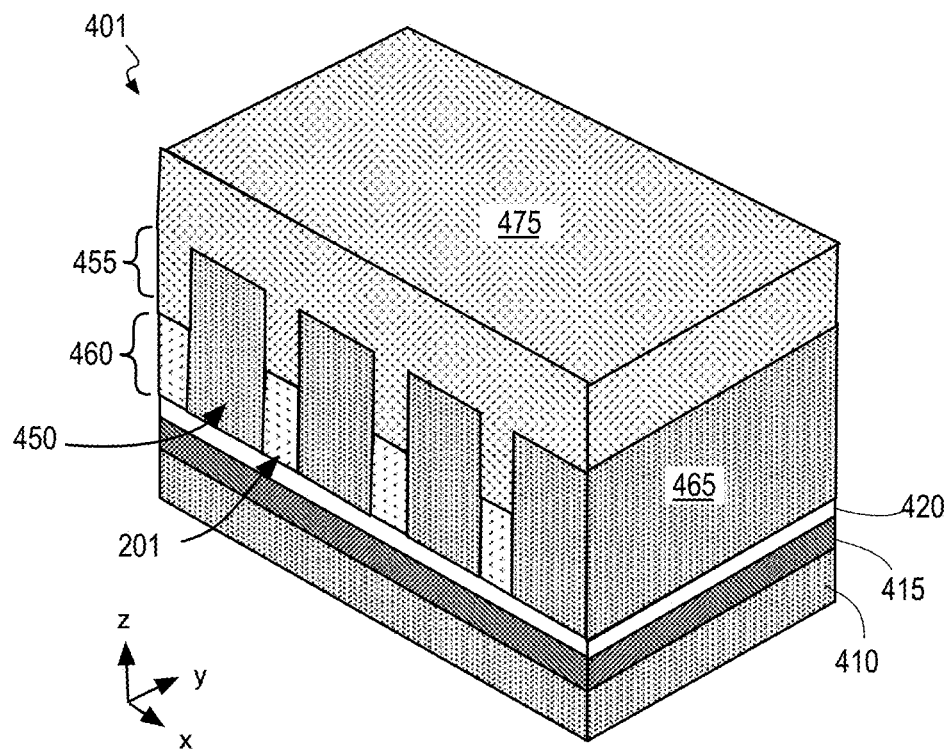

In some embodiments, the first conductive material layer deposited at block 325 has the same composition as the last material layer deposited at block 310, which results in a material homogeneity and/or continuity between the first conductive material layer deposited at block 325 and the underlying material layer. FIG. 4B illustrates an example where IC device interconnect structure 401 now further includes a conductive material layer 475 on both interconnect lines 201 and intervening dielectric material 465. As illustrated with field lines, conductive material layer 475 has the some composition as top line portion 455. In alternative embodiments, for example where top line portion 455 has the same material composition as bottom line portion 460, the first conductive material layer 475 may have a different composition than that of top line portion 460.

Returning to FIG. 3, methods 301 continue at block 330 where second interconnect lines are formed with a subtractive patterning process. In some examples, an unmasked portion of the second conductive material layers are etched, this patterned etch may advantageously proceed further into unprotected portions of the first interconnect lines. The processing at block 330 therefore concurrently defines both interconnect lines of a second interconnect level and a planar slab via between the first and second interconnect levels. In the example illustrated in FIG. 4C, interconnect lines 208 have been subtractively patterned by removing portions of conductive material layer 475 that were not protected by an overlying mask (not depicted). As further shown, regions of top line portion 455 not protected by interconnect lines 208 have also been removed, leaving only bottom line portions 460 as interconnect lines 201.

For embodiments where top line portion 455 and conductive material layer 475 have the same composition, a single etch process may be employed to subtractively define interconnect line 208 as well as define protected regions of top line portion 455 as a planar slab via. Etch selectivity associated with the different compositions of top line portion 455 and bottom line portion 460 may be leveraged to stop on interconnect lines 201. In other embodiments, for example where top line portion 455 and conductive material layer 475 have different compositions, a multi-step etch process may be employed to subtractively define interconnect lines 208, and then subtractively define protected regions of top line portion 455 as a planar slab via. In the absence of any etch selectivity between top line portion 455 and bottom line portion 460, a timed slab via etch process may be used to stop appropriately on interconnect lines 201.

Regions of top line portion 455 that are protected from subtractive patterning are slab vias between interconnect lines 201 and 208. Optionally, dielectric material 465 similarly protected by interconnect lines 208 may also be subtractively patterned as shown, for example with another anisotropic etch process suitable for the dielectric material composition. As illustrated, a subtractive patterning of the crossing interconnect lines 201 and 208 arrive at either of the planar slab interconnect structures 200A (FIG. 2A) or 200B, substantially as introduced above, as a function of the conductive material compostions selected for various levels of the structure. Accordingly, there is a clear relationship between the fabrication processes enlisted in methods 301 and various features of planar slab interconnect structures 200A and 200B. For example, the rectangular cross-section of a slab via is associated with, and indicative of, first sidewalls of the slab via having been subtractively patterned as part of the first interconnect line etch, and second sidewalls of the slab via having been subtractively patterned as part of the second, orthogonally oriented, interconnect line etch.

Returning to FIG. 1, methods 301 continue at block 335 where one or more dielectric materials are deposited over the planar slab interconnect structures. The dielectric material may be further planarized with a top surface of the planar slab interconnect structures, for example to prepare for fabricating a subsequent interconnect level. In some embodiments, methods 301 are repeated, for example returning to block 310. If no additional iterations of methods 301 are to be performed, the IC die structure may be completed at output 340. Completion of the IC die structure may entail any know fabrication operations. In some examples, completion of the IC die at output 340 entails the fabrication of one or more upper interconnect levels using any known techniques, such as, but not limited to damascene techniques. For such examples, lower interconnect levels comprise planar slab interconnect structures while upper interconnect levels comprise non-planar wire interconnect structures associated with a via-fill technique.

Figure 4C:
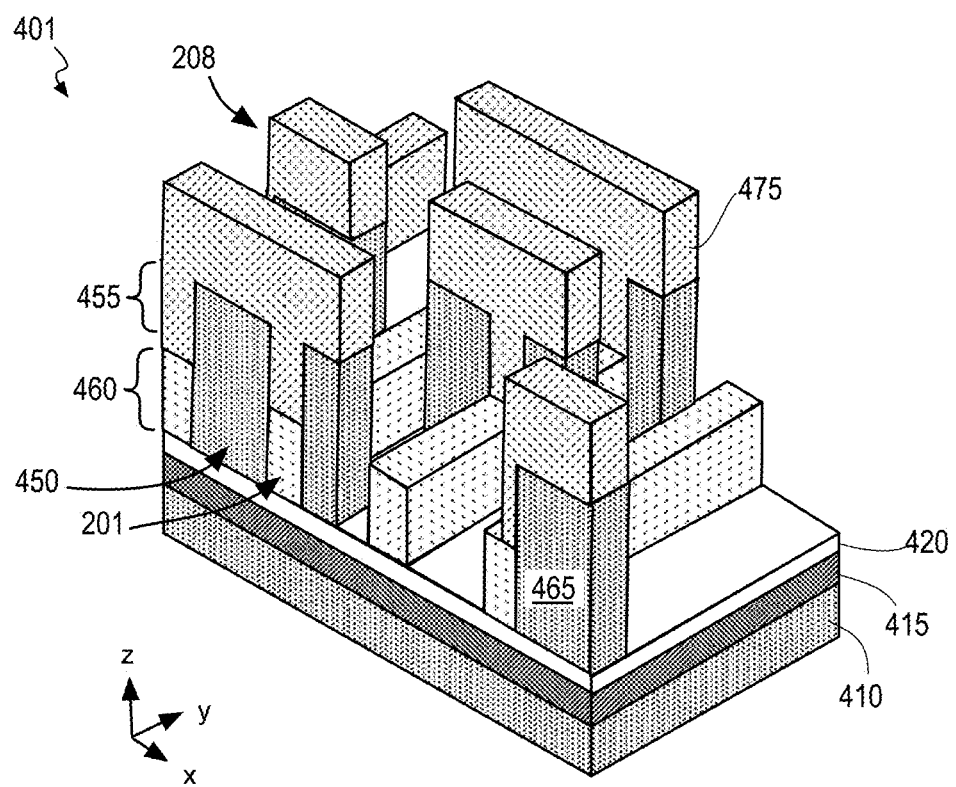
Figure 4D:
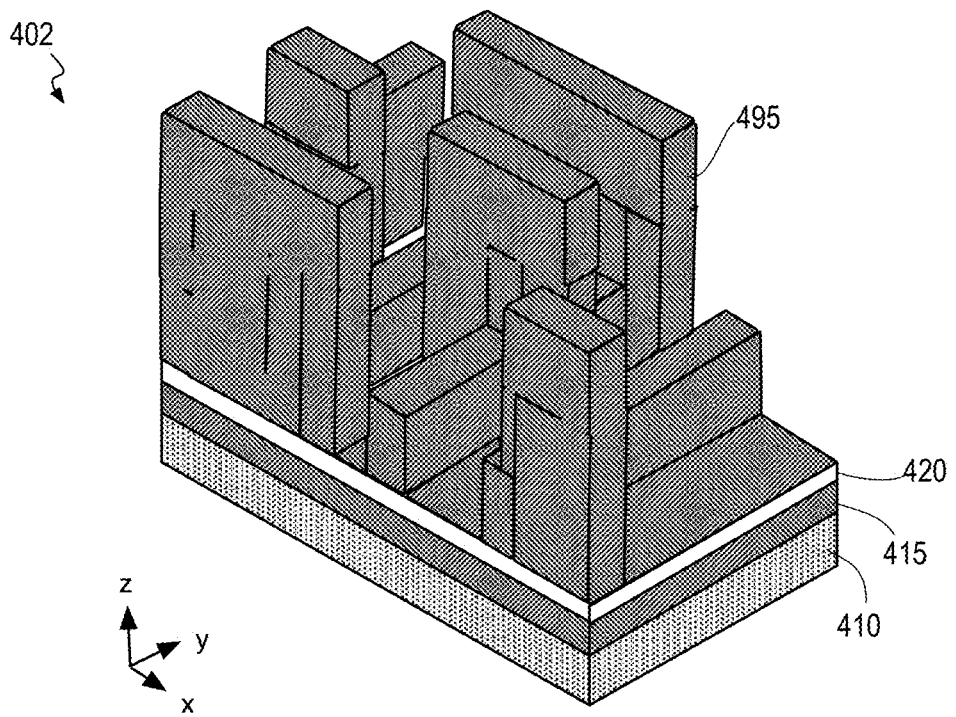
Figure 4E:
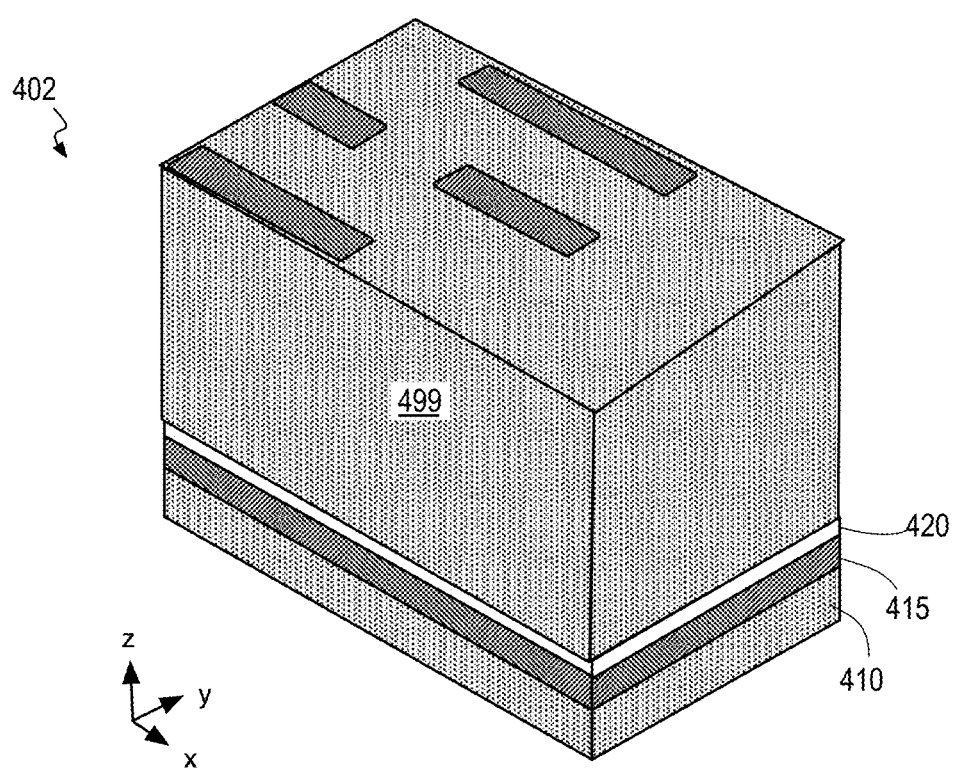

In the example illustrated in FIG. 4D, an IC structure 402 further includes a dielectric encapsulation material 495 that has been deposited substantially conformally over the IC interconnect structure 401 (FIG. 4C). Notably, the highly non-planar nature of dielectric encapsulation material 495 is indicative of dielectric encapsulation material 495 having been deposited over topographic features rather than deposited upon a planarized surface and the topographic features embedded within dielectric encapsulation material 495. Dielectric encapsulation material 495 may have any composition, such as, but not limited to silicon nitride, or silicon oxynitride, for example. FIG. 4E further illustrates an IC structure 403 that further includes a dielectric material 499, which has been planarized with top surfaces of the IC interconnect structure 401 (FIG. 4C). Dielectric material 499 may be deposited, for example with a non-conformal process, and/or deposited over encapsulation material 495, if desired.

Figure 5:
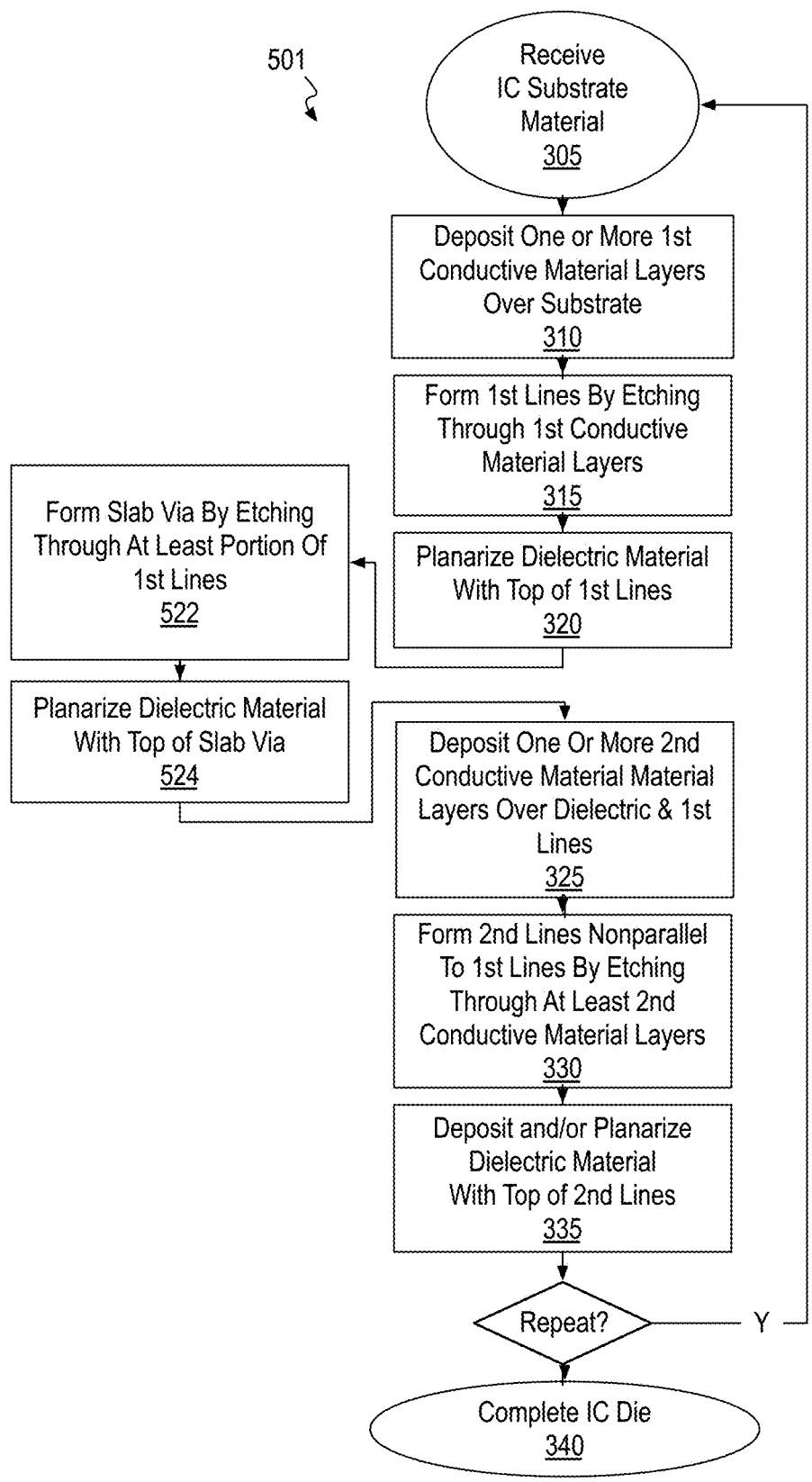
FIG. 5 is a flow diagram illustrating methods of fabricating planar slab interconnect structures, in accordance with some alternative embodiments.
Figure 6A:
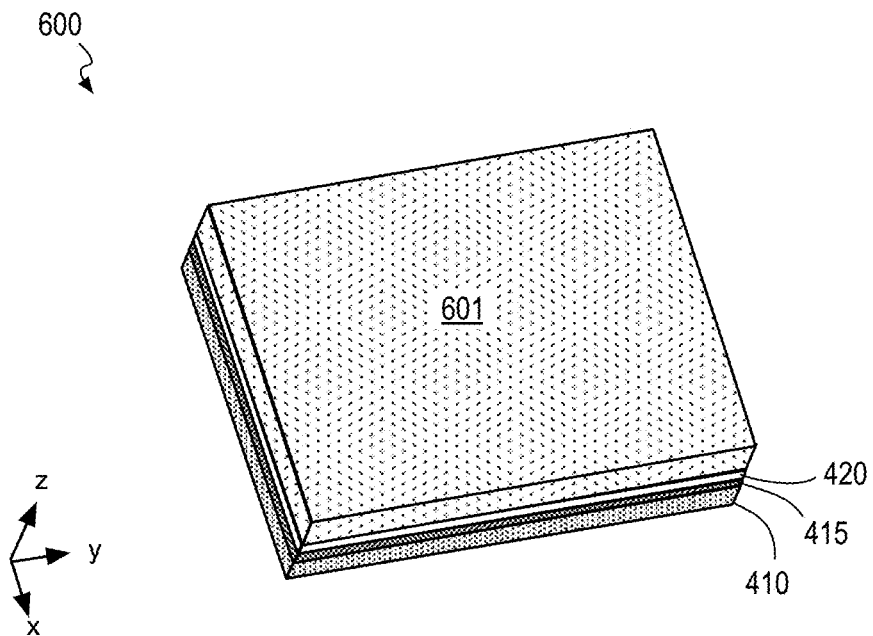
FIG. 6A, 6B, 6C, 6D, 6E, 6F, 6G, 6H, 6I, 6J, 6K, 6L, 6M, and 6N illustrate isometric views of a planar slab interconnect structure that may be formed through the practice of the methods shown in FIG. 5, in accordance with some embodiments.
Figure 6B:
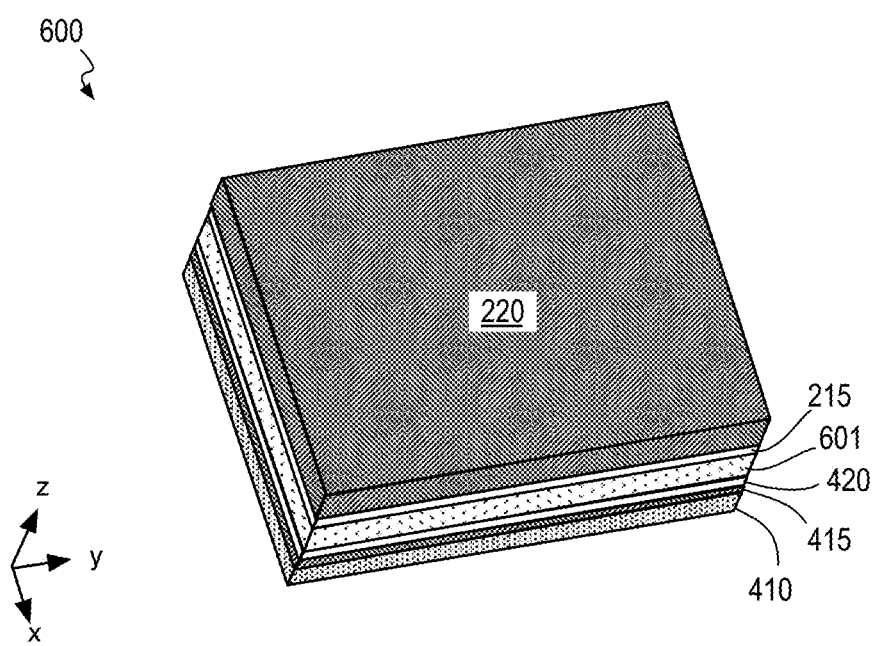
Figure 6C:
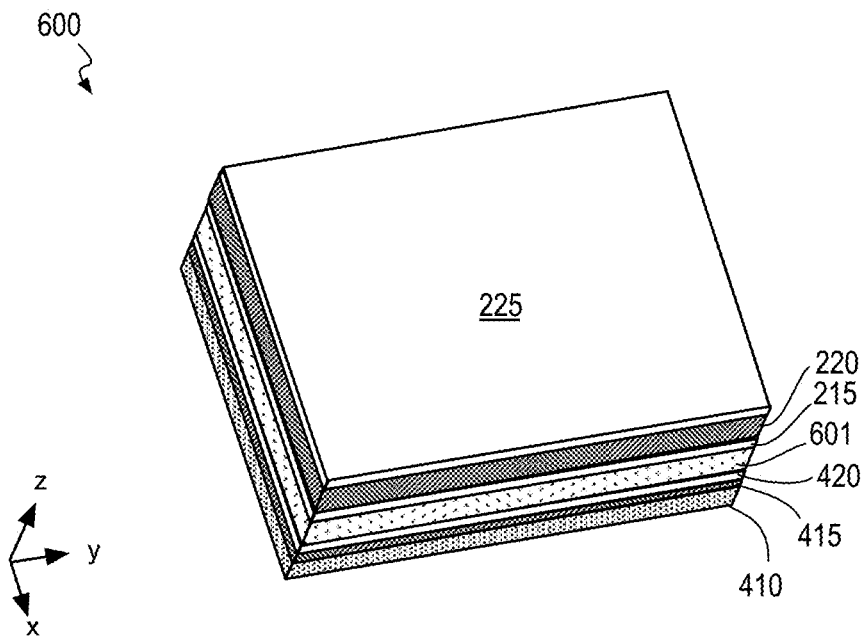
Figure 6D:
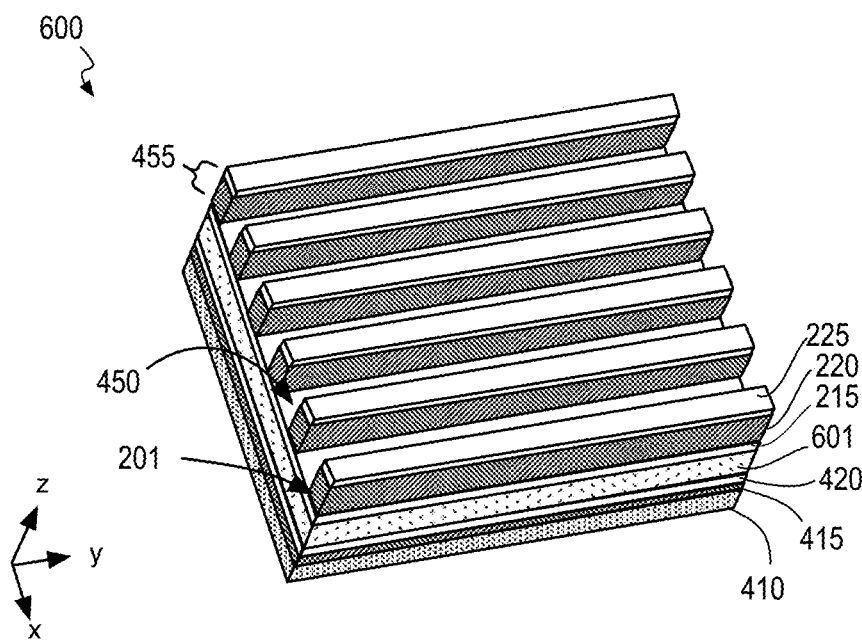
Figure 6E:
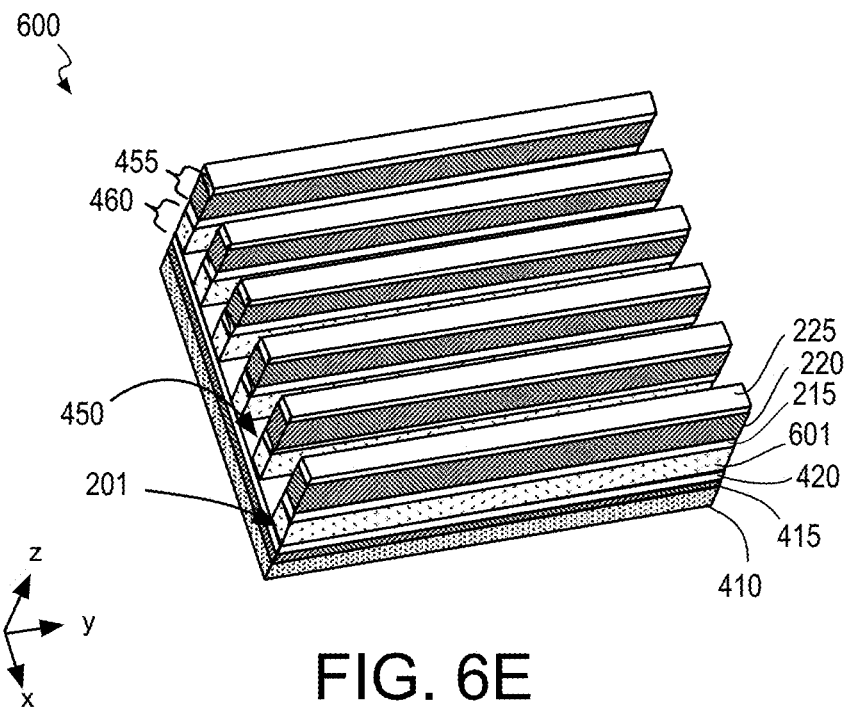
Figure 6F:
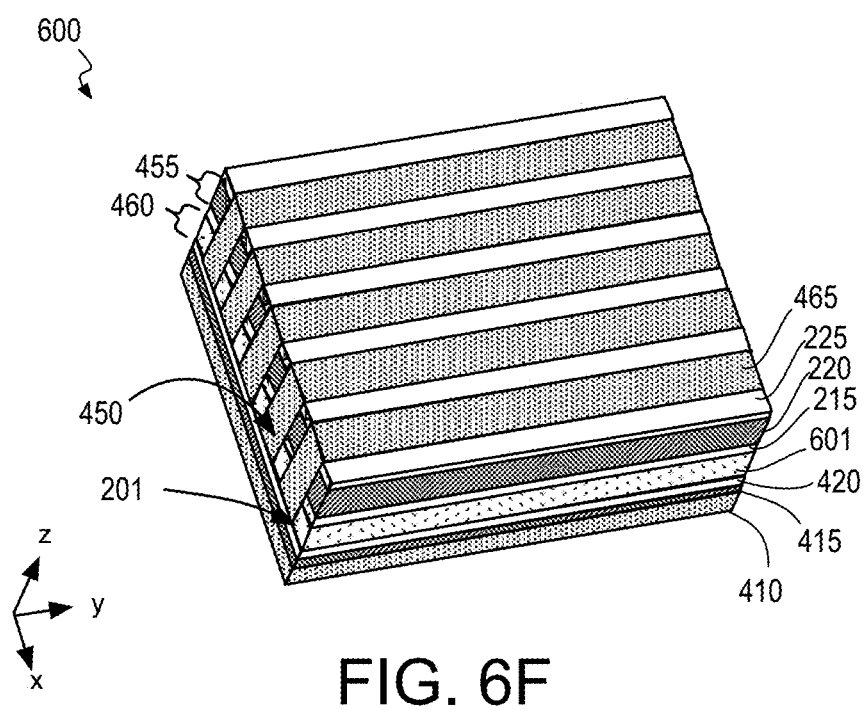
Figure 6G:
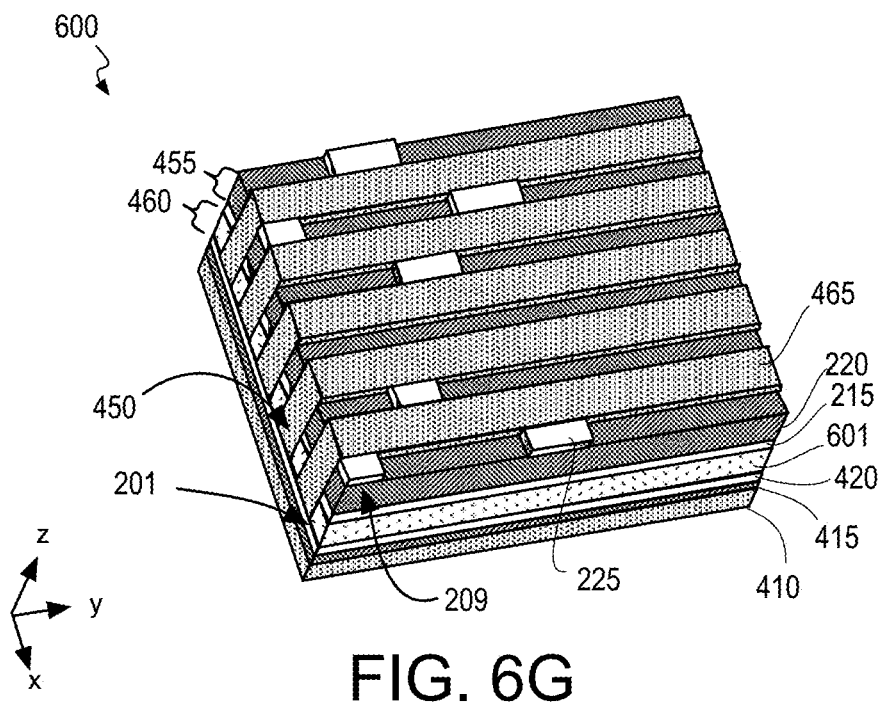
Figure 6H:
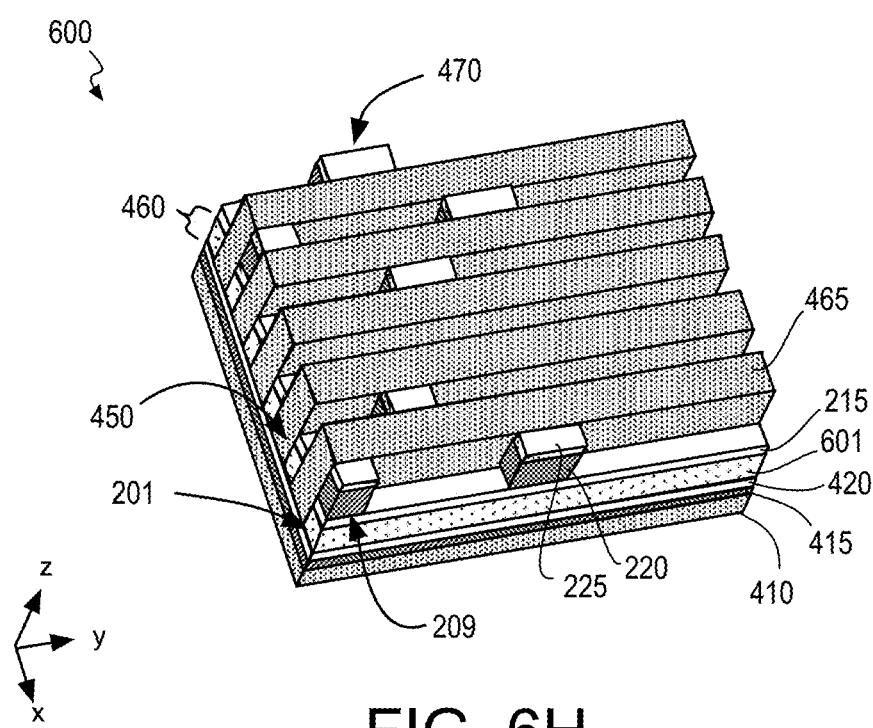
Figure 6I:
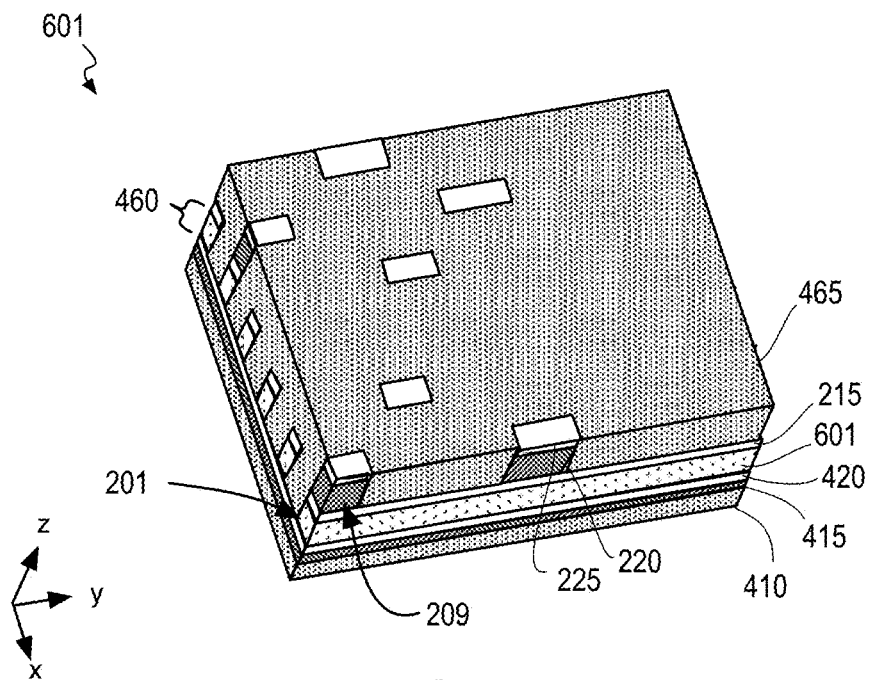

FIG. 5 is a flow diagram illustrating methods 501 for fabricating planar slab interconnect structures, in accordance with some alternative embodiments. Methods 501 share a number blocks with methods 301. Methods 501 further illustrate how an additional masked subtractive patterning process may be employed to arrive at planar slab interconnect structure 200C, introduced in FIG. 2C. Methods 501 may also be practiced to fabricate slab interconnect structures other than slab interconnect structure 200C. Similarly, slab interconnect structure 200C may be fabricated according to methods other than methods 501. FIG. 6A-6N illustrate isometric views of an exemplary planar slab interconnect structure 601 evolving during the practice of the methods 501, in accordance with some embodiments.

Referring first to FIG. 5, methods 501 again begin with receiving a substantially planar IC substrate at input 305. At block 310 one or more first conductive material layers are deposited over the starting substrate. The conductive material layers may have any of the compositions described elsewhere herein, and may be deposited according to any of the techniques described elsewhere herein, for example. FIG. 6A further illustrates an exemplary structure 600 that includes a substantially planar conductive material layer 601 over a substantially planar dielectric layer 420 As described above, dielectric layer 420 is over one or dielectric material layers 415 and device layer 410. FIG. 6B illustrates the further deposition of conductive material layer 215 over conductive material layer 601, and the deposition of conductive material layer 220 on conductive material layer 215. FIG. 6C further illustrates the deposition of another conductive material layer 225 on conductive material layer 220 to complete a substantially planar conductive material layer stack. Although FIG. 6A-6C illustrate successive depositions of individual conductive material layers, in other embodiments all conductive material layers may instead be transferred in bulk from a temporary carrier to the host substrate.

Returning to FIG. 5, methods 501 continue at block 315 where first interconnect lines are formed by subtractively patterning the one or more conductive material layers that were deposited at block 310. In the example illustrated in FIG. 6D, conductive material layers 225 and conductive material layer 220 have been etched into lines 201, exposing conductive material 215 at a bottom of spaces 450 between lines 201. The compositions of conductive material layers 220 and 215 may therefore be selected for etch selectivity, for example with conductive material layer 215 serving as an etch stop. As shown in FIG. 6D, lines 201 at this point comprise only top line portion 455. FIG. 6E further illustrates a continuation of the interconnect line patterning further forming bottom line portion 460, and exposing dielectric material 415 within space 450.

Returning to FIG. 5, methods 501 continue at block 320 where a dielectric material is planarized with a top surface of the first interconnect lines. In the example illustrated in FIG. 6F, dielectric material 465 has been planarized with a top surface of interconnect lines 201. Returning to FIG. 5, methods 501 continue at block 522 where a slab via is formed by subtractively patterning regions of the first interconnect lines. Masking at block 522 may entail mask lines (or other polygons) that cross the first interconnect lines, and the subtractive patterning may entail another etch of at least the top conductive material layer of the first interconnect lines. In the example illustrated in FIG. 6G, subtractive definition of slab via 209 begins with an etch (e.g., anisotropic RIE) through conductive material layer 225 in regions not protected by an etch mask (not depicted). FIG. 6H further illustrates subtractive definition of slab via 209 as conductive material layer 220 has been further etched through in the unmasked regions. Notably, the slab via height ($H_V$) may be made more or less than what is illustrated in FIG. 6H. For example, in some embodiments, a timed etch may be employed to etch through less than the full thickness of conductive material layer 220. Alternatively, conductive material layer 215 may instead be positioned over a portion of conductive material layer 220 so that the etch stop is reached sooner. As further described below, the depth of the etch performed at block 522 determines a vertical height of interconnect lines 201 and so, resistance of interconnect lines 201 may be controlled, in part by the depth of the etch at block 522.

Returning to FIG. 5, methods 501 continue at block 523 where a dielectric material is planarized with the top of the first lines (i.e., top surface of slab vias). In the example illustrated in FIG. 6I, another dielectric material 465 has been deposited over interconnect lines 201, and planarized with a top surface of slab vias 209. With the top surface of the structures formed thus far now substantially planarized, methods 501 (FIG. 5) return to block 325 where one or more second conductive materials are deposited over the dielectric material and over the top surfaces of the first interconnect lines (i.e., top surfaces of the slab via portions of the first lines). Methods 501 then continue substantially as described above for methods 301, with second interconnect lines in contact with the slab vias subtractively patterned at block 330. One or more dielectric materials may then be deposited over the resulting slab interconnect structures at block 335, if desired.

Figure 6J:
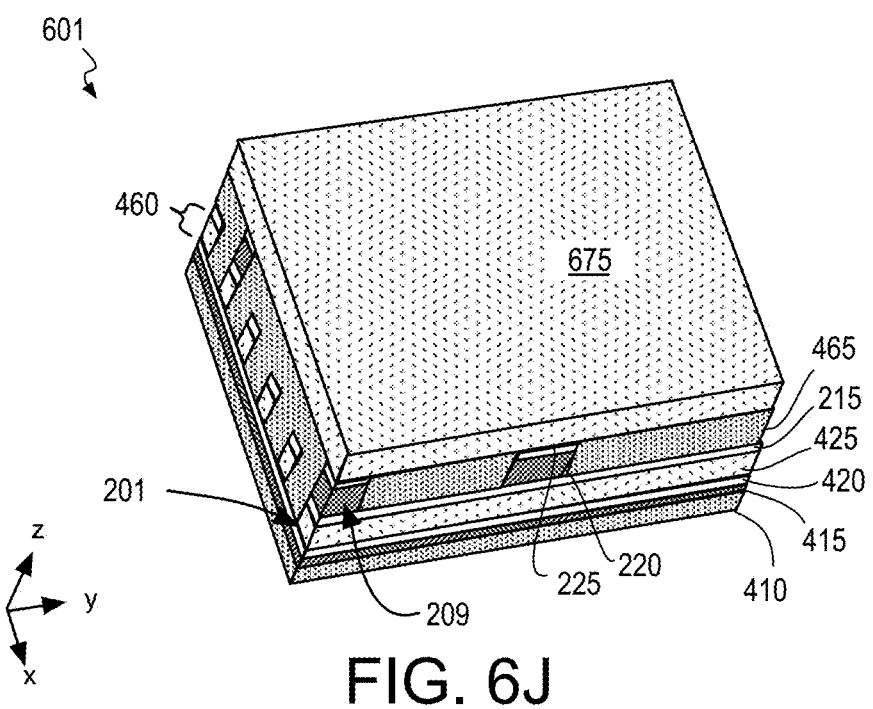
Figure 6K:
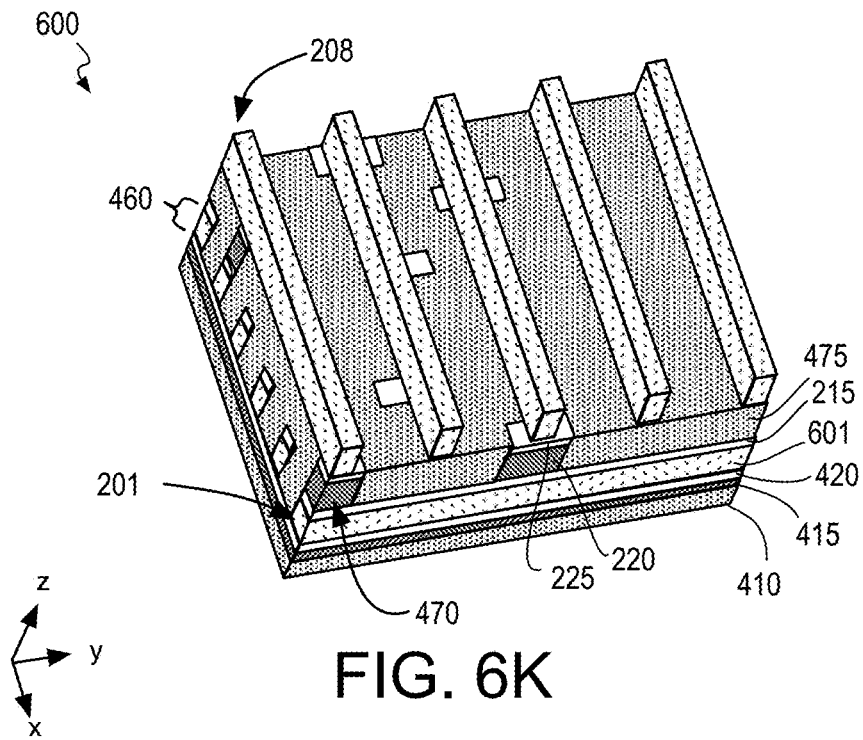

FIG. 6J illustrates a deposition of a conductive material layer 675 in contact with conductive material 225 (as the top layer of slab vias 209), and over dielectric material 465. Conductive material layer 675 is again blanket deposited (or layer transferred) on to a substantially planar surface. Conductive material layer 675 may have any material composition. In the illustrated embodiment conductive material layer 675 has substantially the same chemical composition as that of conductive material layer 601. As further illustrated in FIG. 6K, conductive material layer 675 is subtractively patterned into interconnect lines 208. At this point, planar slab interconnect structure 600 may be substantially complete. One or more dielectric materials may be deposited and planarized with interconnect lines 208, for example in preparation for another iteration of methods 301 or 501, or any another interconnect fabrication process.

Figure 6L:
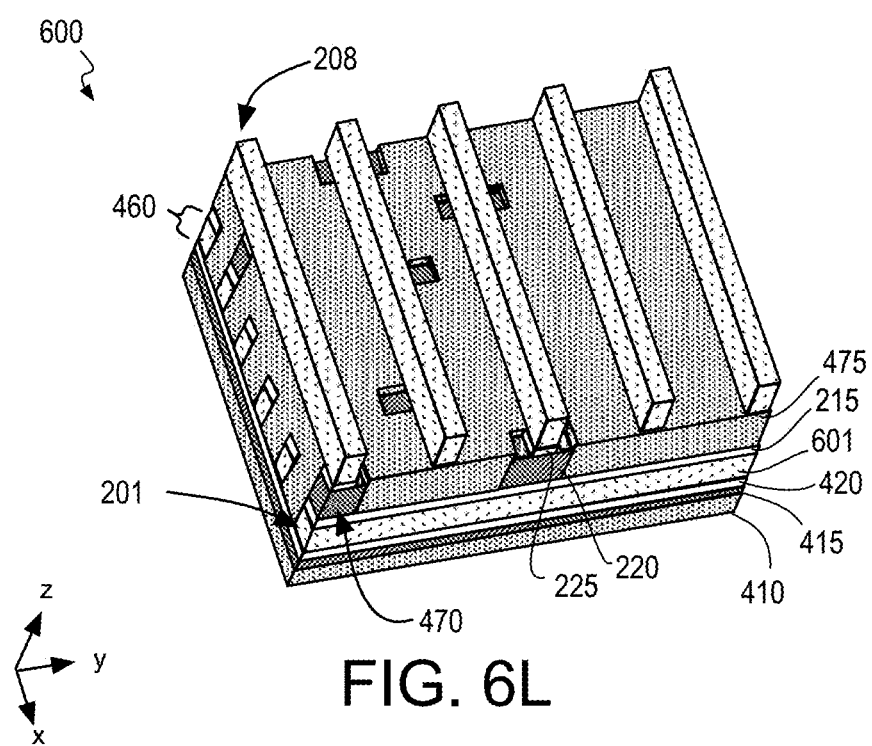
Figure 6M:
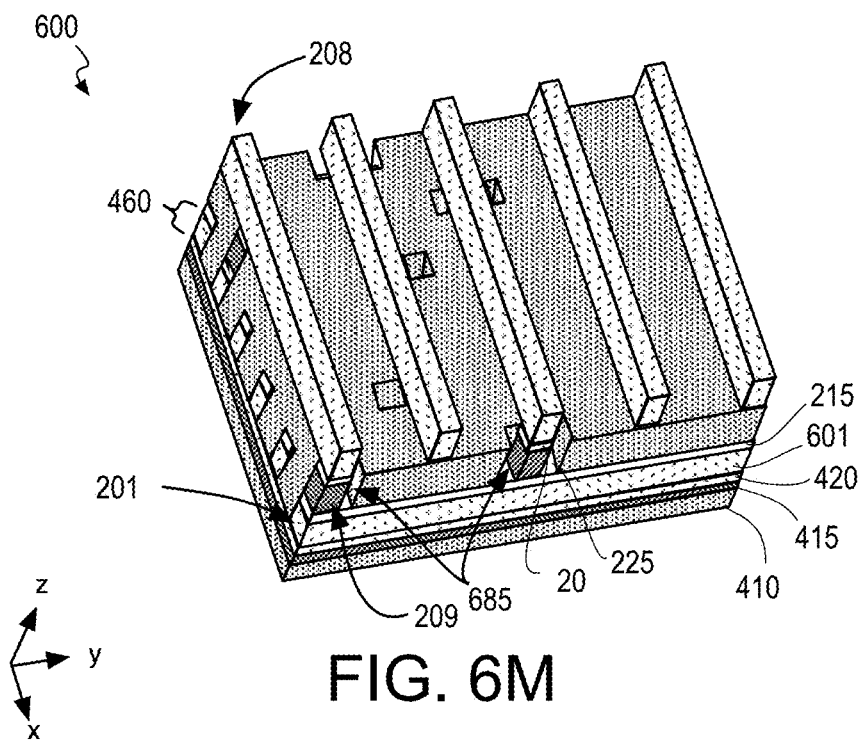
Figure 6N:
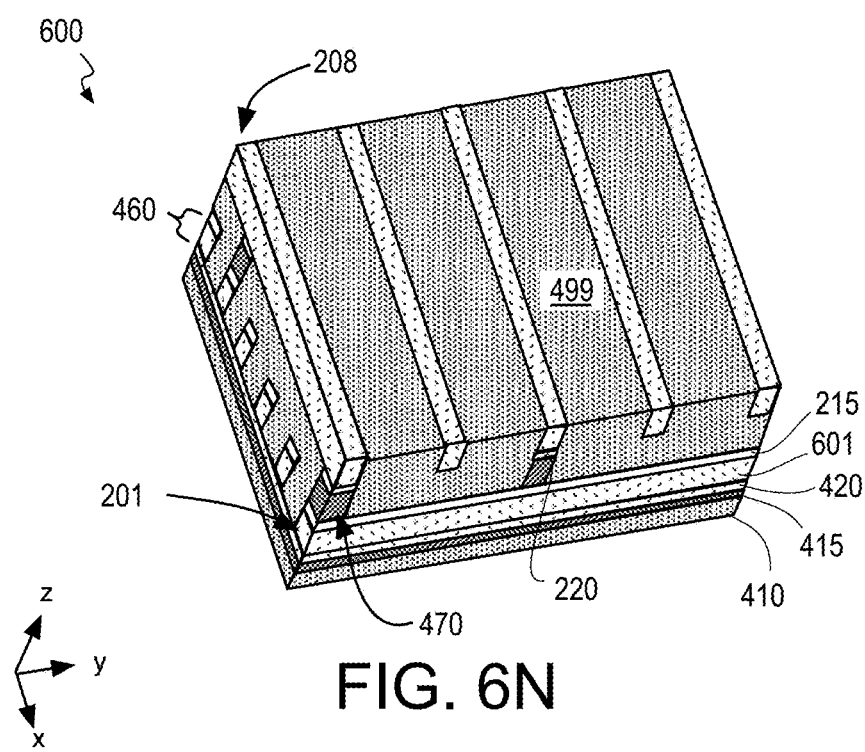

Alternatively, as illustrated in FIG. 6L and FIG. 6M, a subtractive patterning of second sidewalls of slab via 209, in alignment with sidewalls of interconnect lines 208, may be continued with a further anisotropic etch of conductive materials 225 and 220. As shown in FIG. 6M, the y-dimension of slab via 209 may be reduced to perfectly match the y-dimensional CD of interconnect lines 208 just as the x-dimension of slab via 209 perfectly matches the x-dimensional CD of interconnect lines 201. Although not depicted in FIG. 6M, the slab via subtractive patterning illustrated in FIG. 6M may entail an etch that goes deeper than the etch for the slab via subtractive patterning illustrated in FIG. 6F-6H. Such an embodiment may, for example, reduce electrical resistance in long runs of interconnect lines 201 between slab vias 209 by retaining a greater line thickness except locally to the slab via.

FIG. 6N illustrates a substantially complete planar slab interconnect structure 600 following the deposition and planarization of dielectric material 499.

Figure 7:
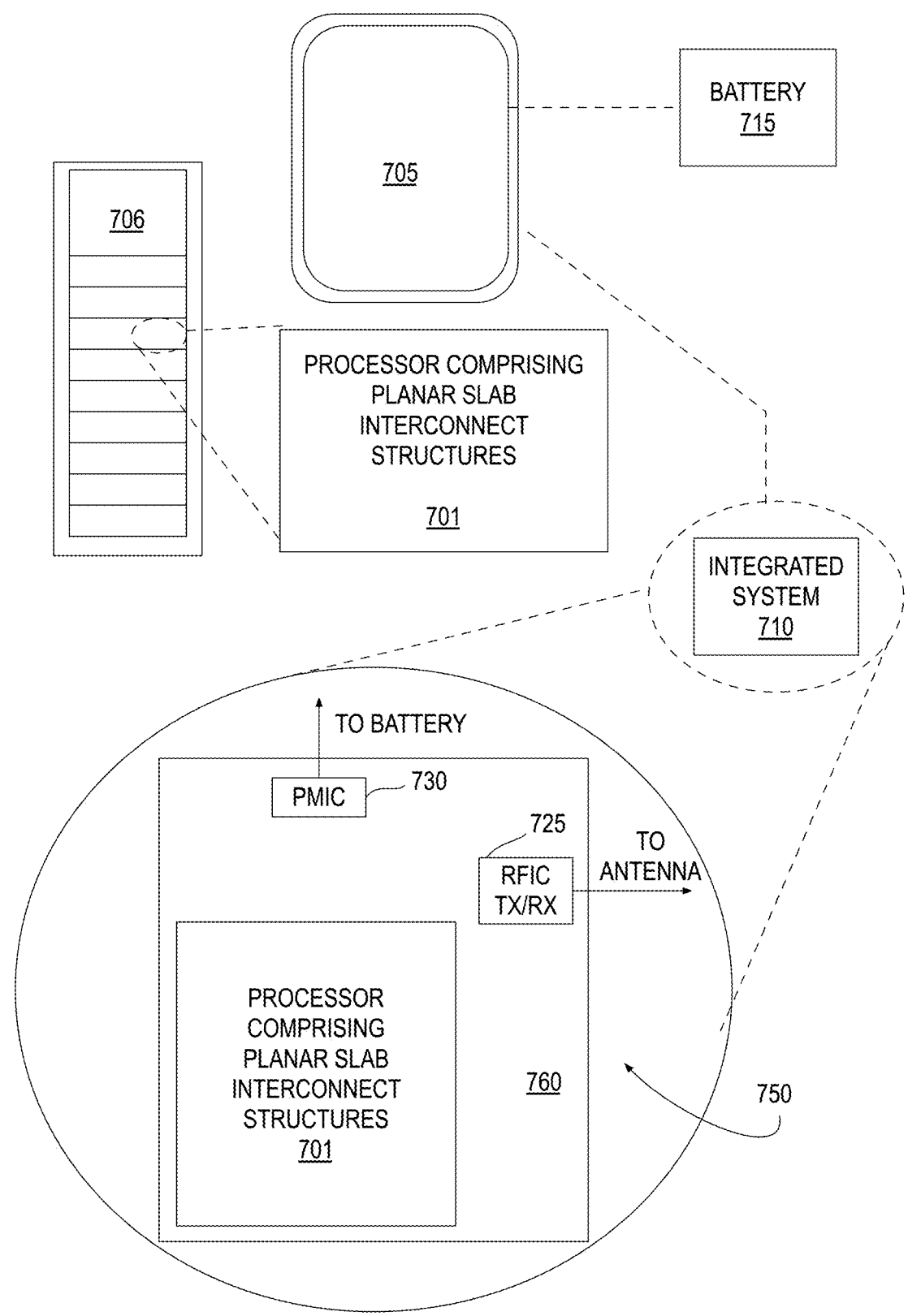
FIG. 7 is a functional block diagram of an electronic computing device, in accordance with some embodiments.

The planar slab interconnect structures and methods of manufacture described above may be integrated into a wide variety of ICs and computing systems that include such ICs. FIG. 7 illustrates a system in which a mobile computing platform 705 and/or a data server machine 706 employs an IC including planar slab interconnect structures, for example in accordance with some embodiments described elsewhere herein. The server machine 706 may be any commercial server, for example including any number of high-performance computing platforms disposed within a rack and networked together for electronic data processing, which in the exemplary embodiment includes a monolithic IC 701. The mobile computing platform 705 may be any portable device configured for each of electronic data display, electronic data processing, wireless electronic data transmission, or the like. For example, the mobile computing platform 705 may be any of a tablet, a smart phone, laptop computer, etc., and may include a display screen (e.g., a capacitive, inductive, resistive, or optical touchscreen), a chip-level integrated system 710, and a battery 715.

Whether disposed within the integrated system 710 illustrated in the expanded view 750, or as a stand-alone packaged chip within the server machine 706, IC 701 may include memory circuitry (e.g., RAM), and/or a logic circuitry (e.g., a microprocessor, a multi-core microprocessor, graphics processor, or the like) at least one of which further includes planar slab interconnect structures, for example in accordance with some embodiments described elsewhere herein. IC 701 may be further coupled to a board, a substrate, or an interposer 760 that further hosts one or more additional ICs, such as power management IC 730 and radio frequency IC 725. IC 725 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 8:
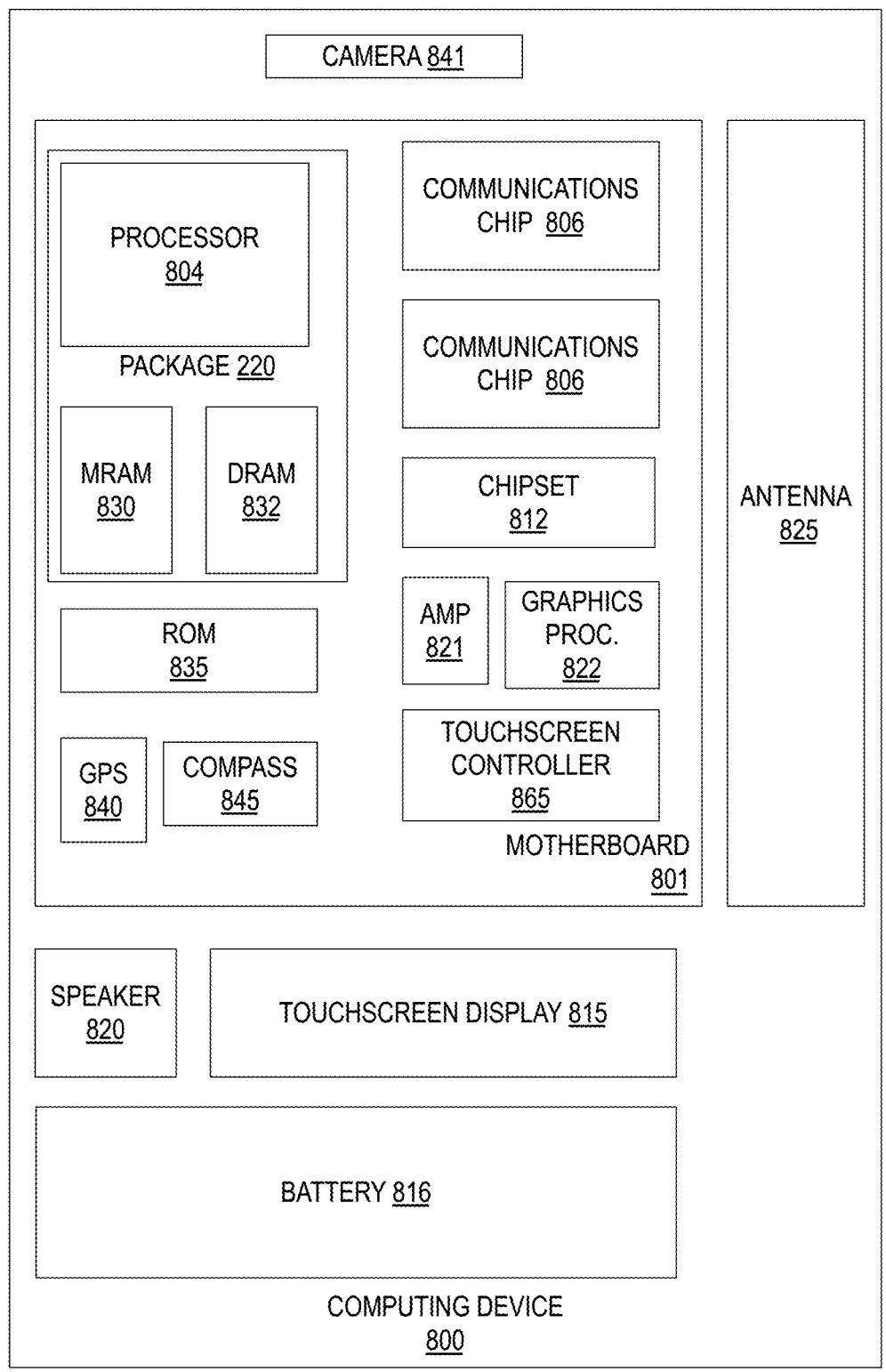

FIG. 8 is a functional block diagram of an electronic computing device 800, in accordance with some embodiments. Device 800 further includes a motherboard 802 hosting a number of components, such as, but not limited to, a processor 804 (e.g., an applications processor). Processor 804 may be physically and/or electrically coupled to motherboard 801. In some examples, processor 804 is part of a monolithic IC structure, for example including planar slab interconnects, as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 806 may also be physically and/or electrically coupled to the motherboard 802. In further implementations, communication chips 806 may be part of processor 804. Depending on its applications, computing device 800 may include other components that may or may not be physically and electrically coupled to motherboard 802. These other components include, but are not limited to, volatile memory (e.g., DRAM 832), non-volatile memory (e.g., ROM 835), flash memory (e.g., NAND or NOR), magnetic memory (MRAM 830), a graphics processor 822, a digital signal processor, a crypto processor, a chipset 812, an antenna 825, touchscreen display 815, touchscreen controller 865, battery 816, audio codec, video codec, power amplifier 821, global positioning system (GPS) device 840, compass 845, accelerometer, gyroscope, speaker 820, camera 841, and mass storage device (such as hard disk drive, solid-state drive (SSD), compact disk (CD), digital versatile disk (DVD), and so forth, or the like.

Communication chips 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 806 may implement any of a number of wireless standards or protocols, including, but not limited to, those described elsewhere herein. As discussed, computing device 800 may include a plurality of communication chips 806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) structure comprises a device level comprising a plurality of device structures, and electrical interconnects coupling the device structures into circuitry. The electrical interconnects comprise a first interconnect line in a first interconnect level, the first interconnect line having a first surface defining a first plane. The electrical interconnects comprise a second interconnect line in a second interconnect level, the second interconnect line having a second surface defining a second plane, substantially parallel to the first plane. The electrical interconnects comprise a slab via interconnecting the first interconnect line to the second interconnect line. The slab via has a substantially rectangular cross-section within a plane that is at an interface of the first interconnect line or second interconnect line, and that is substantially parallel to the first plane.

In second examples, for any of the first examples, the first interconnect line extends in a first direction and has a first width, and the cross-section has a first dimension substantially equal to the first width.

In third examples, for any of the second examples the second line extends in a second direction, non-parallel to the first direction and has a second width, and wherein the cross-section has a second dimension that is unequal to the second width.

In fourth examples, for any of the third examples the second dimension is greater than the second width.

In fifth examples, for any of the third examples the cross-section is a first cross-section at an interface with the first interconnect line, wherein the slab via has a substantially rectangular second cross-section at an interface with the second interconnect line, and wherein a first dimension of the second cross-section is also substantially equal to the first width.

In sixth examples, for any of the third examples the cross-section is a first cross-section at an interface with the first interconnect line, the slab via has a substantially rectangular second cross-section at an interface with the second interconnect line, a first dimension of the first cross-section is substantially equal to the first width, and a second dimension of the second cross-section is substantially equal to the second width.

In seventh examples, for any of the sixth examples a second dimension of the first cross-section is substantially equal to the second width, and the first dimension of the second cross-section is substantially equal to the first width.

In eighth examples, for any of the first through seventh examples the slab via has substantially the same composition as at least one of the first or second interconnect lines.

In ninth examples, for any of the first through eighth examples the slab via comprises a stack of two or material layers, and individual layers of the stack are all substantially parallel to the first plane.

In tenth examples, for any of the ninth examples, a first of the material layers interfaces with the first interconnect line, and a second of the material layers interfaces with the second interconnect line.

In eleventh examples, for any of the first through the tenth examples the slab via comprises a metal, graphite, or carbon nanotubes.

In twelfth examples, for any of the eleventh examples, the slab via comprises at least one of W, Ru, Mo, Al, or Ti.

In thirteenth examples, an integrated circuit (IC) structure comprises a device level comprising transistor structures, electrical interconnects coupling the transistor structures into circuitry. The electrical interconnects comprise a first interconnect line extending laterally within a first plane, and a second interconnect line having a first line segment extending laterally within a second plane, and a second line segment extending vertically, substantially orthogonal to the first and second planes. The first and second line segments are contiguous, and the second line segment is in contact with the first interconnect line.

In fourteenth examples, for any of the thirteenth examples the second interconnect line has a different composition that the first interconnect line.

In fifteenth examples, for any of the thirteenth examples the first interconnect line is above the second interconnect line.

In sixteenth examples, for any of the thirteenth examples the first interconnect line is below the second interconnect line.

In seventeenth examples, a method of fabricating an IC structure comprises depositing one or more first metals over a substrate comprising a device layer with one or more device structures. The method comprises forming first lines by etching through the first metals. The method comprises planarizing a dielectric material with a top of the first lines. The method comprises depositing one or more second metals over the dielectric and over the top of the first lines. The method comprises forming second lines over the first lines by etching through at least the second metals.

In eighteenth examples, for any of the seventeenth examples the one or more first metals comprises a stack of at least two first metals of different composition, and etching through at least the second metals further comprises forming a slab via between the first lines and second lines by etching through a portion of the topmost one of the first metals in the stack that is unprotected by the second metals.

In nineteenth examples, for any of the eighteenth examples the topmost one of the first metals has the same composition as at least one of the second metals in contact with the topmost one of the first metals.

In twentieth examples, for any of the seventeenth through nineteenth examples the one or more first metals comprise a stack of at least two first metals of different composition. Etching through the first metals further comprises forming a slab via over a portion of the first lines by masking a portion of the first lines and etching through a topmost one of the first metals in the stack that is unprotected by the mask, and planarizing the dielectric material with a top of the first lines comprises planarizing the dielectric material with a top of the slab via.

In twenty-first examples, for any of the seventeenth through twentieth examples the method further comprises at least one of conformally depositing a dielectric material over sidewalls of the second lines and the slab via, or planarizing a dielectric material with the top of the second lines.

In twenty-second examples, for any of the seventeenth through twenty-first examples the second lines are non-parallel to the first lines, and etching through the second metals exposes the first lines.

In twenty-third examples, for any of the seventeenth through twenty-second examples at least one of the first metals or the second metals comprise a stack of at least two metals of different composition.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
a device level comprising a plurality of device structures; and
an electrical interconnect structure coupling the device structures into circuitry, wherein the electrical interconnect structure comprises:
a first interconnect line in a first interconnect level, the first interconnect line having a first surface defining a first plane, wherein the first interconnect line extends in a first direction and has a first width;
a second interconnect line in a second interconnect level, the second interconnect line having a second surface defining a second plane, substantially parallel to the first plane, wherein the second line extends in a second direction, non-parallel to the first direction, and has a second width; and
a slab via interconnecting the first interconnect line to the second interconnect line, wherein the slab via has a substantially rectangular cross-section within a plane that is at an interface of the first interconnect line or second interconnect line, and that is substantially parallel to the first plane, wherein a cross-section of the slab via at an interface with the first interconnect line has a first dimension in the second direction that is substantially equal to the first width, or wherein a cross-section of the slab via at an interface of the second interconnect line has a second dimension in the first direction that is substantially equal to the second width.

2. The IC structure of claim 1, wherein a cross-section of the slab via at the interface with the first interconnect line has a first dimension in the second direction that is substantially equal to the first width, and wherein a cross-section of the slab via at the interface of the second interconnect line has a second dimension in the first direction that is substantially equal to the second width.

3. The IC structure of claim 2, wherein the cross-section of the slab via at the interface with the first interconnect line has a second dimension in the first direction that is unequal to the second width.

4. The IC structure of claim 3, wherein the second dimension is greater than the second width.

5. The IC structure of claim 1, further comprising:
first dielectric material adjacent a first side of the slab via; and a second dielectric material adjacent to a side of the second interconnect line and a second side of the slab via.

6. The IC structure of claim 1, wherein a second dimension of the cross-section at the interface of the first interconnect line is substantially equal to the second width, and wherein the first dimension of the cross-section at the interface of the second interconnect line is substantially equal to the first width.

7. The IC structure of claim 1, wherein the slab via has substantially the same composition as at least one of the first or second interconnect lines.

8. The IC structure of claim 1, wherein the slab via comprises a stack of two or material layers, and wherein individual layers of the stack are all substantially parallel to the first plane.

9. The IC structure of claim 8, wherein a first of the material layers interfaces with the first interconnect line and a second of the material layers interfaces with the second interconnect line.

10. The IC structure of claim 1, wherein the slab via comprises a metal, graphite, or carbon nanotubes.

11. The IC structure of claim 10, wherein slab via comprises at least one of W, Ru, Mo, Al, or Ti.

12. An integrated circuit (IC) structure, comprising:
a device level comprising semiconductor device structures; and
electrical interconnects coupling the semiconductor device structures into circuitry, wherein the electrical interconnects comprise:
a first interconnect line extending laterally within a first plane; and
a second interconnect line having a first line segment extending laterally within a second plane, and a second line segment extending vertically, substantially orthogonal to the first and second planes, wherein the first and second line segments are compositionally homogeneous, and wherein the second line segment is in contact with the first interconnect line.

13. The IC structure of claim 12, wherein the second interconnect line has a different composition that the first interconnect line.

14. The IC structure of claim 12, wherein the first interconnect line is above the second interconnect line.

15. The IC structure of claim 12, wherein the first interconnect line is below the second interconnect line.

* * * * *